US012625440B2

(12) United States Patent
Takakuwa

(10) Patent No.: US 12,625,440 B2
(45) Date of Patent: May 12, 2026

(54) SEMICONDUCTOR STRUCTURE BODY AND METHOD FOR MANUFACTURING SEMICONDUCTOR STRUCTURE BODY WITH ALIGNMENT BETWEEN STORIES OF THE SAME

(71) Applicant: Kioxia Corporation, Tokyo (JP)

(72) Inventor: Manabu Takakuwa, Tsu Mie (JP)

(73) Assignee: Kioxia Corporation, Tokyo (JP)

( * ) Notice: Subject to any disclaimer, the term of this patent is extended or adjusted under 35 U.S.C. 154(b) by 453 days.

(21) Appl. No.: 18/182,527

(22) Filed: Mar. 13, 2023

(65) Prior Publication Data

US 2023/0408936 A1     Dec. 21, 2023

(30) Foreign Application Priority Data

Jun. 20, 2022     (JP) ................................. 2022-098523

(51) Int. Cl.
| | |
|---|---|
| *H10B 41/20* | (2023.01) |
| *G03F 9/00* | (2006.01) |
| *H01L 23/544* | (2006.01) |
| *H10B 43/20* | (2023.01) |
| *H10W 46/00* | (2026.01) |

(52) U.S. Cl.
CPC ............ *G03F 9/708* (2013.01); *G03F 9/7076* (2013.01); *H10B 41/20* (2023.02); *H10B 43/20* (2023.02); *H10W 46/00* (2026.01); *H10W 46/301* (2026.01)

(58) Field of Classification Search
CPC ..... G03F 9/708; G03F 9/7076; H01L 23/544; H01L 2223/54426; H10B 41/20; H10B 43/20; H10B 43/10

USPC .......................................................... 257/797
See application file for complete search history.

(56) References Cited

U.S. PATENT DOCUMENTS

| | | | |
|---|---|---|---|
| 6,921,916 | B2 | 7/2005 | Adel et al. |
| 6,985,618 | B2 | 1/2006 | Adel et al. |
| 7,068,833 | B1 | 6/2006 | Ghinovker et al. |
| 7,177,457 | B2 | 2/2007 | Adel et al. |
| 7,181,057 | B2 | 2/2007 | Adel et al. |
| 7,242,477 | B2 | 7/2007 | Mieher et al. |
| 7,274,814 | B2 | 9/2007 | Ghinovker et al. |
| 7,280,212 | B2 | 10/2007 | Mieher et al. |

(Continued)

FOREIGN PATENT DOCUMENTS

| | | |
|---|---|---|
| JP | 2010251746 A | 11/2010 |
| JP | 2012080131 A | 4/2012 |

(Continued)

*Primary Examiner* — Duy T Nguyen
(74) *Attorney, Agent, or Firm* — Maier & Maier, PLLC

(57)     ABSTRACT

A semiconductor structure body of an embodiment includes a stacked body. In the stacked body, a plurality of conductive layers and a plurality of insulating layers are alternately stacked, and a plurality of through holes penetrating the conductive layers and the insulating layers in the stacking direction are provided. In the interior of the stacked body, in a region corresponding to an identical pair of coordinates in a planar coordinate system intersecting the stacking direction, a plurality of identical alignment marks or deviation measurement marks are formed, with one or more stories each including a predetermined number of conductive layers and a predetermined number of insulating layers interposed therebetween.

8 Claims, 27 Drawing Sheets

(56)  References Cited

U.S. PATENT DOCUMENTS

| | | | |
|---|---|---|---|
| 7,289,213 B2 | 10/2007 | Mieher et al. | |
| 7,298,481 B2 | 11/2007 | Mieher et al. | |
| 7,301,634 B2 | 11/2007 | Mieher et al. | |
| 7,317,531 B2 | 1/2008 | Mieher et al. | |
| 7,317,824 B2 | 1/2008 | Ghinovker et al. | |
| 7,355,291 B2 | 4/2008 | Adel et al. | |
| 7,379,183 B2 | 5/2008 | Mieher et al. | |
| 7,385,699 B2 | 6/2008 | Mieher et al. | |
| 7,433,040 B2 | 10/2008 | Mieher et al. | |
| 7,440,105 B2 | 10/2008 | Adel et al. | |
| 7,541,201 B2 | 6/2009 | Ghinovker | |
| 7,564,557 B2 | 7/2009 | Mieher et al. | |
| 7,663,753 B2 | 2/2010 | Mieher et al. | |
| 7,876,440 B2 | 1/2011 | Mieher et al. | |
| 7,879,627 B2 | 2/2011 | Ghinovker et al. | |
| 7,933,016 B2 | 4/2011 | Mieher et al. | |
| 8,138,498 B2 | 3/2012 | Ghinovker | |
| 8,330,281 B2 | 12/2012 | Ghinovker et al. | |
| 8,502,355 B2 | 8/2013 | Lee | |
| 8,625,096 B2 | 1/2014 | Sewell et al. | |
| RE45,245 E | 11/2014 | Ghinovker | |
| 9,182,680 B2 | 11/2015 | Ghinovker | |
| 9,347,879 B2 | 5/2016 | Adel et al. | |
| 9,702,693 B2 | 7/2017 | Ghinovker et al. | |
| 10,115,680 B2 | 10/2018 | Kusakabe | |
| 10,325,857 B2 | 6/2019 | Kasa | |
| 10,451,412 B2 | 10/2019 | Adel et al. | |
| 2012/0061732 A1* | 3/2012 | Hirai | H10N 70/063 |
| | | | 257/E27.07 |
| 2019/0164899 A1* | 5/2019 | Hu | G03F 1/42 |
| 2020/0159133 A1* | 5/2020 | Yan | H01L 24/80 |
| 2020/0365420 A1* | 11/2020 | Chen | H01L 21/78 |
| 2021/0320031 A1* | 10/2021 | Kim | H10B 43/40 |

FOREIGN PATENT DOCUMENTS

| | | |
|---|---|---|
| JP | 2012124457 A | 6/2012 |
| JP | 2020031204 A | 2/2020 |
| JP | 6762897 B2 | 9/2020 |
| JP | 6901358 B2 | 7/2021 |

* cited by examiner

FIG.8

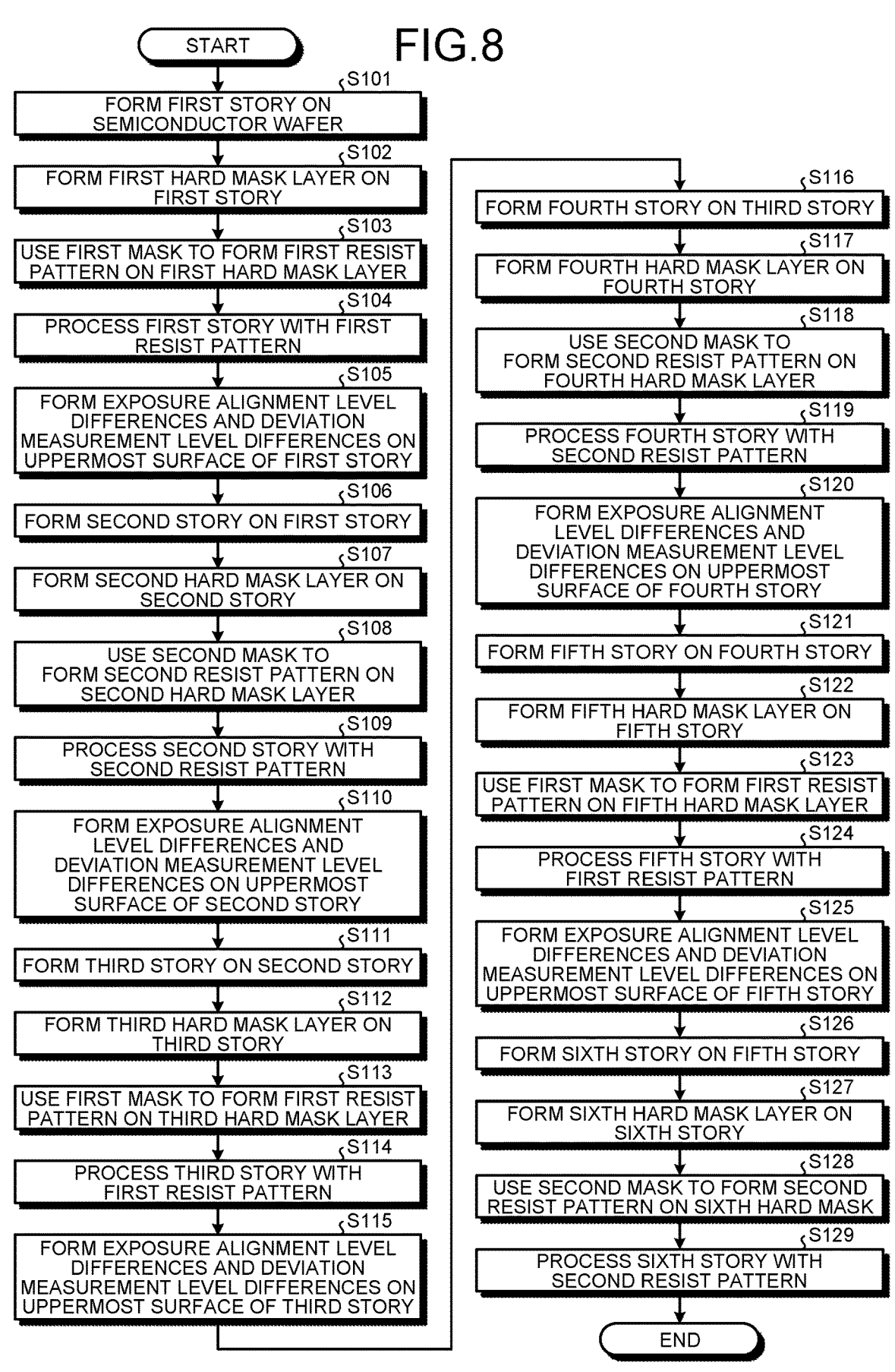

START

S101
FORM FIRST STORY ON SEMICONDUCTOR WAFER

S102
FORM FIRST HARD MASK LAYER ON FIRST STORY

S103
USE FIRST MASK TO FORM FIRST RESIST PATTERN ON FIRST HARD MASK LAYER

S104
PROCESS FIRST STORY WITH FIRST RESIST PATTERN

S105
FORM EXPOSURE ALIGNMENT LEVEL DIFFERENCES AND DEVIATION MEASUREMENT LEVEL DIFFERENCES ON UPPERMOST SURFACE OF FIRST STORY

S106
FORM SECOND STORY ON FIRST STORY

S107
FORM SECOND HARD MASK LAYER ON SECOND STORY

S108
USE SECOND MASK TO FORM SECOND RESIST PATTERN ON SECOND HARD MASK LAYER

S109
PROCESS SECOND STORY WITH SECOND RESIST PATTERN

S110
FORM EXPOSURE ALIGNMENT LEVEL DIFFERENCES AND DEVIATION MEASUREMENT LEVEL DIFFERENCES ON UPPERMOST SURFACE OF SECOND STORY

S111
FORM THIRD STORY ON SECOND STORY

S112
FORM THIRD HARD MASK LAYER ON THIRD STORY

S113
USE FIRST MASK TO FORM FIRST RESIST PATTERN ON THIRD HARD MASK LAYER

S114
PROCESS THIRD STORY WITH FIRST RESIST PATTERN

S115
FORM EXPOSURE ALIGNMENT LEVEL DIFFERENCES AND DEVIATION MEASUREMENT LEVEL DIFFERENCES ON UPPERMOST SURFACE OF THIRD STORY

S116
FORM FOURTH STORY ON THIRD STORY

S117
FORM FOURTH HARD MASK LAYER ON FOURTH STORY

S118
USE SECOND MASK TO FORM SECOND RESIST PATTERN ON FOURTH HARD MASK LAYER

S119
PROCESS FOURTH STORY WITH SECOND RESIST PATTERN

S120
FORM EXPOSURE ALIGNMENT LEVEL DIFFERENCES AND DEVIATION MEASUREMENT LEVEL DIFFERENCES ON UPPERMOST SURFACE OF FOURTH STORY

S121
FORM FIFTH STORY ON FOURTH STORY

S122
FORM FIFTH HARD MASK LAYER ON FIFTH STORY

S123
USE FIRST MASK TO FORM FIRST RESIST PATTERN ON FIFTH HARD MASK LAYER

S124
PROCESS FIFTH STORY WITH FIRST RESIST PATTERN

S125
FORM EXPOSURE ALIGNMENT LEVEL DIFFERENCES AND DEVIATION MEASUREMENT LEVEL DIFFERENCES ON UPPERMOST SURFACE OF FIFTH STORY

S126
FORM SIXTH STORY ON FIFTH STORY

S127
FORM SIXTH HARD MASK LAYER ON SIXTH STORY

S128
USE SECOND MASK TO FORM SECOND RESIST PATTERN ON SIXTH HARD MASK

S129
PROCESS SIXTH STORY WITH SECOND RESIST PATTERN

END

FIG.16

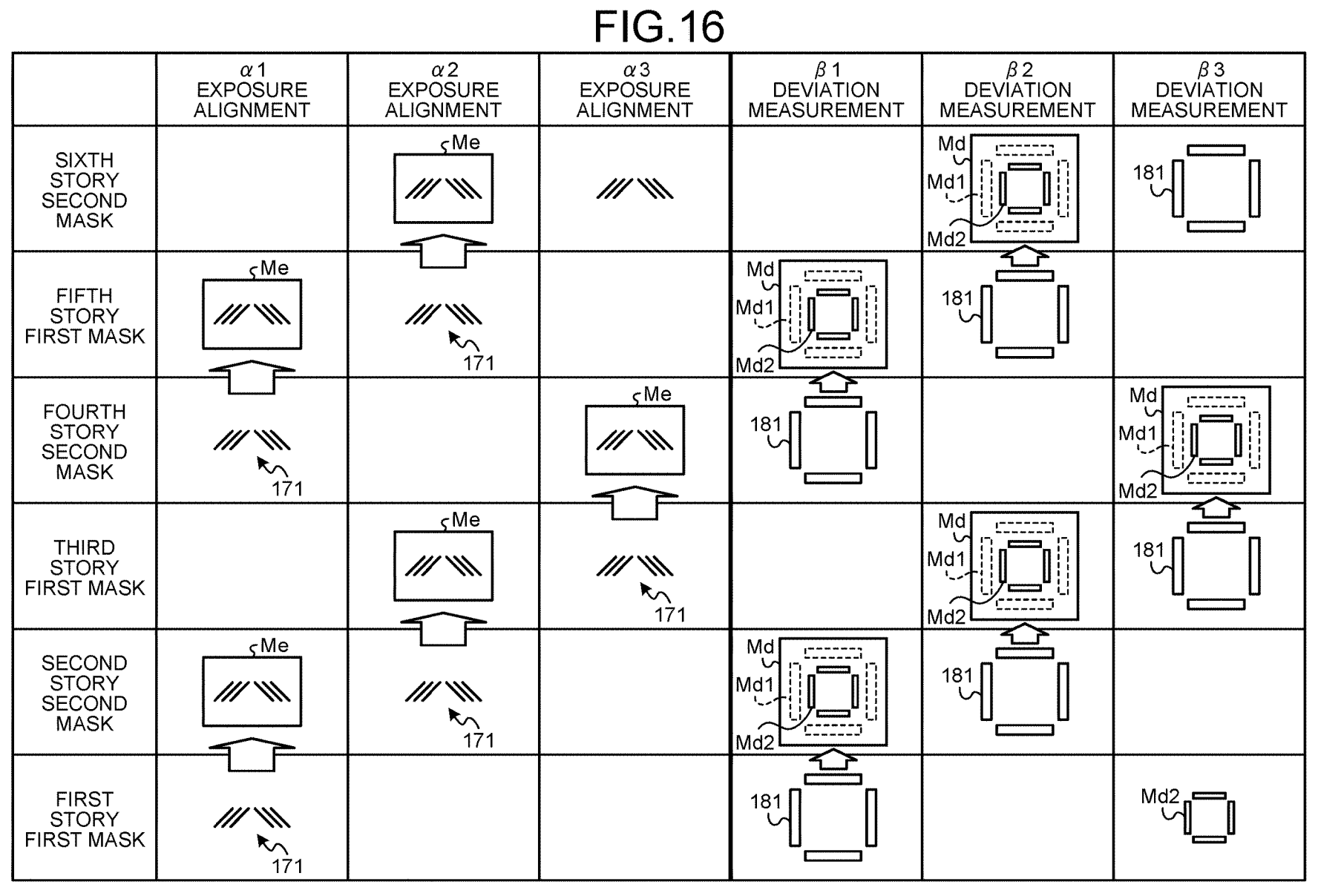

| | α1 EXPOSURE ALIGNMENT | α2 EXPOSURE ALIGNMENT | α3 EXPOSURE ALIGNMENT | β1 DEVIATION MEASUREMENT | β2 DEVIATION MEASUREMENT | β3 DEVIATION MEASUREMENT |
|---|---|---|---|---|---|---|
| SIXTH STORY SECOND MASK | | | | | Md Md1 Md2 | 181 |
| FIFTH STORY FIRST MASK | Me | Me | | Md Md1 Md2 | 181 | |
| FOURTH STORY SECOND MASK | | Me / 171 | Me / 171 | 181 | | Md Md1 Md2 / 181 |
| THIRD STORY FIRST MASK | Me / 171 | | | Md Md1 Md2 | 181 | |
| SECOND STORY SECOND MASK | Me | Me / 171 | | 181 | Md Md1 Md2 | |
| FIRST STORY FIRST MASK | / 171 | | / 171 | | 181 | Md2 |

SEMICONDUCTOR STRUCTURE BODY AND METHOD FOR MANUFACTURING SEMICONDUCTOR STRUCTURE BODY WITH ALIGNMENT BETWEEN STORIES OF THE SAME

CROSS-REFERENCE TO RELATED APPLICATIONS

This application is based upon and claims the benefit of priority from Japanese Patent Application No. 2022-098523, filed on Jun. 20, 2022; the entire contents of which are incorporated herein by reference.

FIELD

Embodiments described herein relate generally to a semiconductor structure body and a method for manufacturing a semiconductor structure body.

BACKGROUND

A three-dimensional stacked semiconductor memory device in which a plurality of memory cells are three-dimensionally arranged in a stacked body in which a plurality of conductive layers and a plurality of insulating layers are alternately stacked is used. In such a semiconductor memory device, an increase in the number of stacked layers of the stacked body is required in order to increase the storage capacity. As a technique for achieving an increase in the number of stacked layers, there is a technique of dividing a stacked body into a plurality of stories and forming stacked bodies in stages for stories. In the case where stacked bodies are thus formed in stages, the processing of alignment between stories is needed, but conventional technology has problems of an increase in cost, a reduction in working efficiency, etc. because a mask for forming an alignment mark needs to be prepared for each story.

BRIEF DESCRIPTION OF THE DRAWINGS

FIG. 8 is a flowchart illustrating an example of part of processing in a method for manufacturing a semiconductor memory device of the embodiment;

FIG. 16 is a diagram conceptually illustrating an example of exposure alignment processing and deviation measurement processing of the first modification example;

DETAILED DESCRIPTION

According to an embodiment, a semiconductor structure body is provided. The semiconductor structure body includes a stacked body. In the stacked body, a plurality of conductive layers and a plurality of insulating layers are alternately stacked, and a plurality of through holes penetrating the conductive layers and the insulating layers in the stacking direction are provided. In the interior of the stacked body, in a region corresponding to an identical pair of coordinates in a planar coordinate system intersecting the stacking direction, a plurality of identical alignment marks or deviation measurement marks are formed, with one or more stories each including a predetermined number of conductive layers and a predetermined number of insulating layers interposed therebetween.

Hereinbelow, a semiconductor structure body and a method for manufacturing a semiconductor structure body according to an embodiment are described in detail with reference to the accompanying drawings. Note that the present invention is not limited by this embodiment. In addition, cross-sectional views, etc. used in the following embodiment are schematic ones, and the relationship between the thickness and the width of a layer, the ratio of the thickness of each layer, etc. may be different from actual ones.

Figure 1:
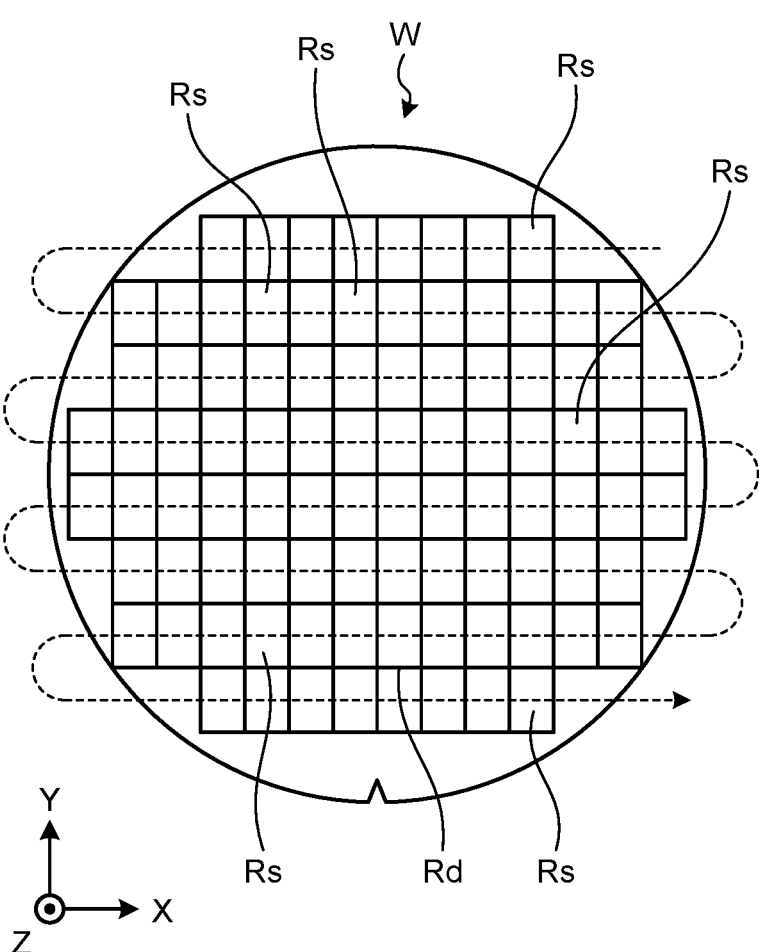
FIG. 1 is a plan view illustrating an example of a configuration of a wafer of an embodiment.

FIG. 1 is a plan view illustrating an example of a configuration of a wafer W of an embodiment. In FIG. 1, the X direction corresponds to a direction from left to right on the paper surface, the Y direction corresponds to a direction from bottom to top on the paper surface, and the Z direction corresponds to a direction from back to front of the paper surface. The X direction, the Y direction, and the Z direction in other drawings correspond to the X direction, the Y direction, and the Z direction in FIG. 1, respectively.

The wafer W is made of silicon or the like, and includes a plurality of shot regions Rs. Each shot region Rs is a region that can be processed by one exposure in photolithography, and is formed in a rectangular shape in the present example. A plurality of shot regions Rs can be sequentially exposed and developed by, for example, moving the exposure range as indicated by the broken arrow.

Figure 2:
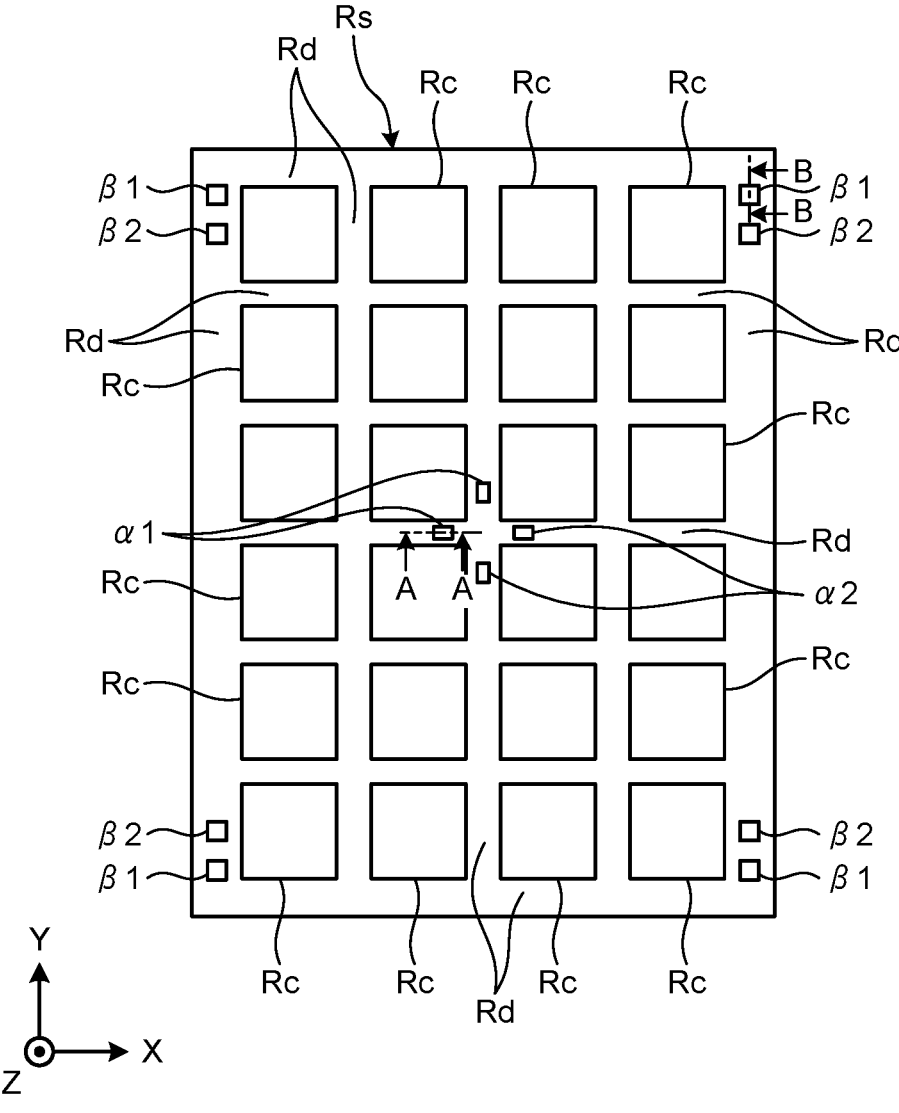
FIG. 2 is a plan view illustrating an example of a configuration of a shot region of the embodiment.

FIG. 2 is a plan view illustrating an example of a configuration of the shot region Rs of the embodiment. The shot region Rs includes a plurality of chip regions Rc and a dicing region Rd. Each chip region Rc is a region where a predetermined semiconductor device is formed; in each chip region Rc, a stacked body in which a plurality of layers (films) having a predetermined device pattern are stacked is formed. The semiconductor device may be, for example, a three-dimensional stacked semiconductor memory device or the like. The dicing region Rd is a region formed to surround the periphery of each chip region Rc. After the processing of the chip region Rc is completed, the wafer W is cut in the dicing region Rd, and thereby each chip region Rc becomes an independent semiconductor device.

The dicing region Rd of the present embodiment is used also as a region for performing alignment processing when forming a stacked body in the chip region Rc. The dicing region Rd includes exposure alignment regions α1 and α2 and deviation measurement regions β1 and β2. The exposure alignment regions α1 and α2 are regions used for exposure alignment processing of adjusting exposure on to the shot region Rs (for example, light irradiation positions or the like), and are arranged in the dicing region Rd near a central portion of the shot region Rs. The deviation measurement regions β1 and β2 are regions used for deviation measurement processing of measuring deviation between stories included in the stacked body, and are arranged in the dicing region Rd near an outer edge portion of the shot region Rs.

The exposure alignment region of the present embodiment includes a first exposure alignment region α1 and a second exposure alignment region α2. The first exposure alignment region α1 is a region corresponding to a first pair of coordinates in a planar coordinate system (a coordinate system corresponding to the XY plane) intersecting the stacking direction of the stacked body. The second exposure alignment region α2 is a region corresponding to a second pair of coordinates different from the first pair of coordinates in the planar coordinate system. Herein, a configuration in which each of the first exposure alignment region α1 and the second exposure alignment region α2 includes two regions is given as an example; however, the configurations of the first exposure alignment region α1 and the second exposure alignment region α2 are not limited thereto, and for example, each of the first exposure alignment region α1 and the second exposure alignment region α2 may include one region or may include three or more regions.

The deviation measurement region of the present embodiment includes a first deviation measurement region β1 and a second deviation measurement region β2. The first deviation measurement region β1 is a region corresponding to a third pair of coordinates different from the first pair of coordinates or the second pair of coordinates in a planar coordinate system (a coordinate system corresponding to the XY plane) intersecting the stacking direction of the stacked body. The second deviation measurement region β2 is a region corresponding to a fourth pair of coordinates different from any of the first to third pairs of coordinates in the plane coordinate system. Herein, a configuration in which each of the first deviation measurement region β1 and the second deviation measurement region β2 includes four regions is given as an example; however, the configurations of the first deviation measurement region β1 and the second deviation measurement region β2 are not limited thereto, and for example, each of the first deviation measurement region β1 and the second deviation measurement region β2 may include one to three regions or may include five or more regions.

The semiconductor structure body of the present embodiment is a structure body including a stacked body formed in the chip region Rc and an alignment mark formed in the dicing region Rd and used for alignment processing.

Figure 3:
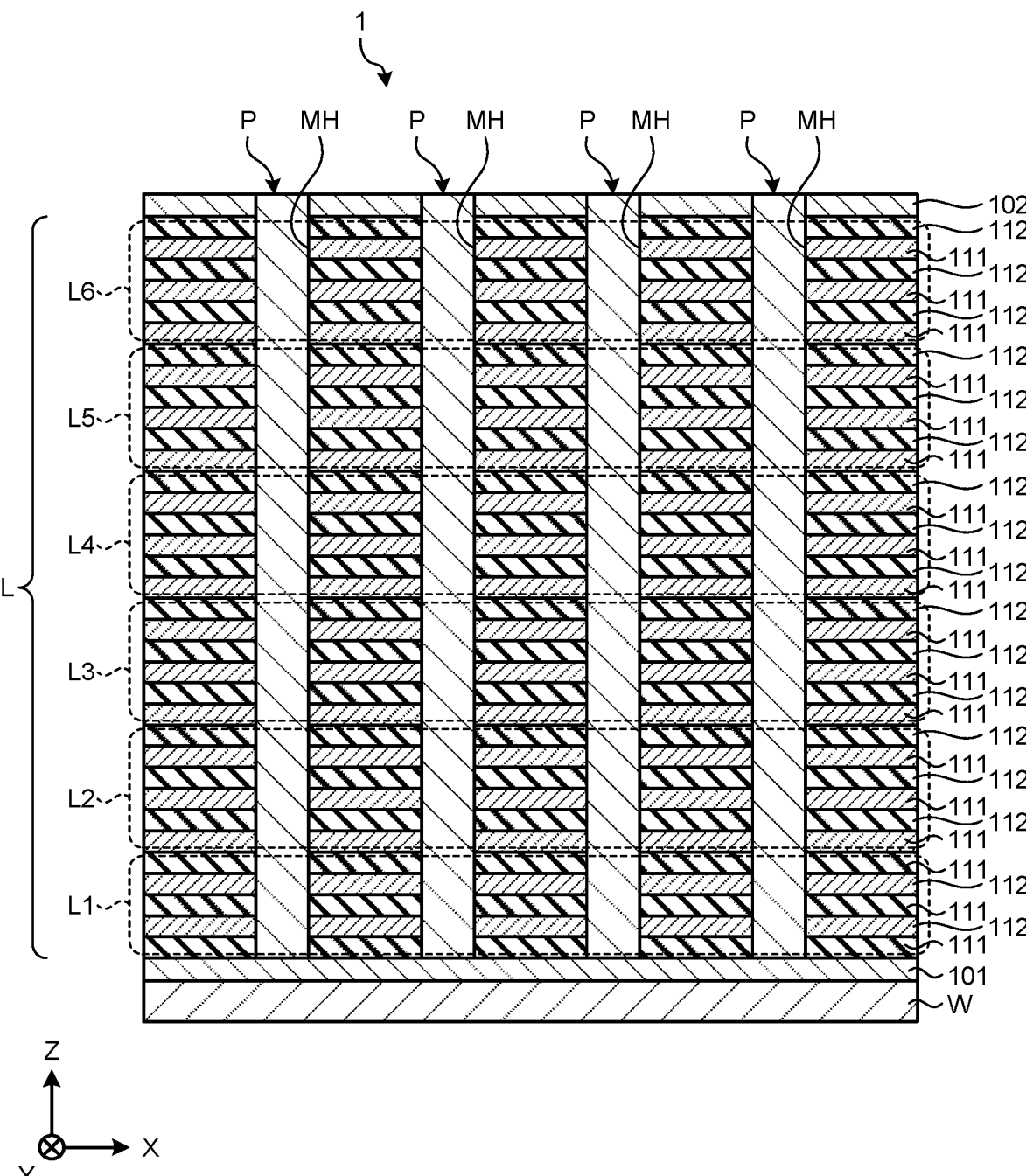
FIG. 3 is a cross-sectional view illustrating an example of a configuration of a stacked body formed in a chip region of the embodiment.

FIG. 3 is a cross-sectional view illustrating an example of a configuration of a stacked body L formed in the chip region Rc of the embodiment. In FIG. 3, a part of a three-dimensional stacked semiconductor memory device 1 is illustrated. The semiconductor memory device 1 includes a wafer W, an underlayer 101, a stacked body L, an upper conductive layer 102, and pillars P. The underlayer 101 is formed of, for example, an insulating film containing silicon oxide, silicon nitride, or the like. The stacked body L is configured by alternately stacking a plurality of conductive layers 111 and a plurality of insulating layers 112. The insulating layer 112 contains, for example, silicon oxide. The upper conductive layer 102 is formed on the stacked body L, and is formed of, for example, a carbon film or the like. Each of the plurality of pillars P is configured by putting a pillar layer in a memory hole MH (an example of a through hole) penetrating the stacked body L and the upper conductive layer 102 in the stacking direction (a direction parallel to the Z direction). The pillar layer includes, for example, a core insulating layer, a semiconductor channel layer, a memory layer, etc., and the memory layer includes, for example, a tunnel insulating layer, a charge storage layer, a block insulating layer, etc. A connection portion between each pillar P and the conductive layer 111 serves as a memory cell. With such a configuration, a memory cell array in which a plurality of memory cells are three-dimensionally arranged is configured.

The stacked body L of the present embodiment is formed in stages for a plurality of stories. In the following, a case where the stacked body L is divided into six stories L1 to L6 and is formed in six stages is described. Herein, a configuration in which the first story L1 includes three conductive layers 111 and two insulating layers 112, and each of the second story L2 to the sixth story L6 includes three conductive layers 111 and three insulating layers 112 is given as an example; however, the number of conductive layers 111 and the number of insulating layers 112 of each of the stories L1 to L6 are not limited thereto. In addition, the number of divisions of the stacked body L is not limited to six. Thus, in the case where the stacked body L is formed in a plurality of stages, alignment processing (exposure alignment processing and deviation measurement processing) for preventing the formation position of the memory hole MH from being deviated among the plurality of stories L1 to L6 is needed.

Figure 4:
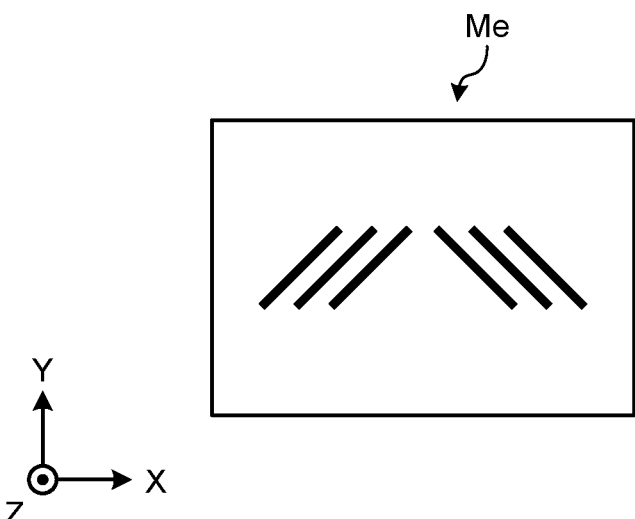
FIG. 4 is a plan view illustrating an example of an exposure alignment mark of the embodiment.

FIG. 4 is a plan view illustrating an example of an exposure alignment mark Me of the embodiment. The exposure alignment mark Me (an example of an alignment mark) is a mark used when performing exposure alignment processing, and is formed in each of the exposure alignment regions α1 and α2 in each shot region Rs. The exposure alignment mark Me given as an example herein has an L/S (line-and-space) pattern including a plurality of straight lines inclined at predetermined angles with respect to the X direction and the Y direction. The position of the wafer W placed on an exposure device that applies light for exposure can be detected on the basis of optical features, etc. of light formed by light applied from the exposure device being reflected or diffracted by the exposure alignment mark Me. The above exposure alignment mark Me is an example, and various known or novel patterns can be used for the exposure alignment mark Me.

Figure 5:
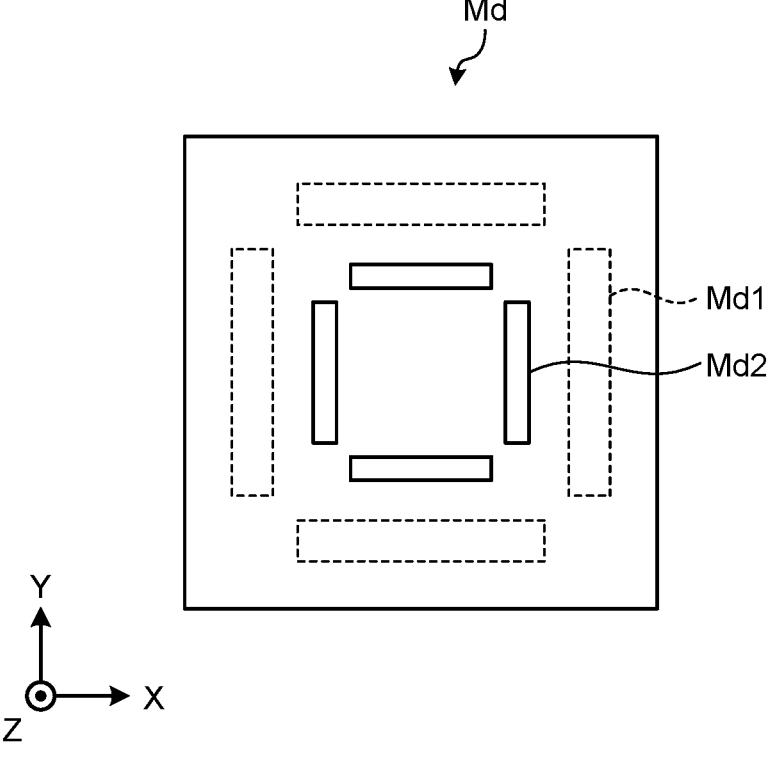
FIG. 5 is a plan view illustrating an example of a deviation measurement mark of the embodiment.

FIG. 5 is a plan view illustrating an example of a deviation measurement mark Md of the embodiment. The deviation measurement mark Md (an example of a deviation measurement mark) is a mark used when executing deviation measurement processing of measuring deviation between a lower layer (for example, the first story L1) and an upper layer (for example, the second story) formed on the lower layer, and is formed in each of the deviation measurement regions β1 and β2 in each shot region Rs. The deviation measurement mark Md given as an example herein includes a first deviation measurement mark Md1 and a second deviation measurement mark Md2 constituting a nested structure. The first deviation measurement mark Md1 includes a pattern of a pair of bars parallel to the Y direction and a pattern of a pair of bars parallel to the X direction. The second deviation measurement mark Md2 includes a pattern of a pair of bars parallel to the Y direction and a pattern of a pair of bars parallel to the X direction, and is placed on the inside of the first deviation measurement mark Md1. The first deviation measurement mark Md1 is formed on the surface of the upper layer by level differences formed in the lower layer propagating to the upper layer. The second deviation measurement mark Md2 is formed on a resist film or the like formed on the surface of the upper layer. The deviation between the lower layer and the upper layer can be measured on the basis of the positional relationship between the first deviation measurement mark Md1 and the second deviation measurement mark Md2 (the gap, angle, etc. between the bar patterns). The above deviation measurement mark Md is an example, and various known or novel patterns can be used for the deviation measurement mark Md.

In the present embodiment, alignment processing like the above is performed using two kinds of masks (a photomask, a reticle, etc.).

Figure 6:
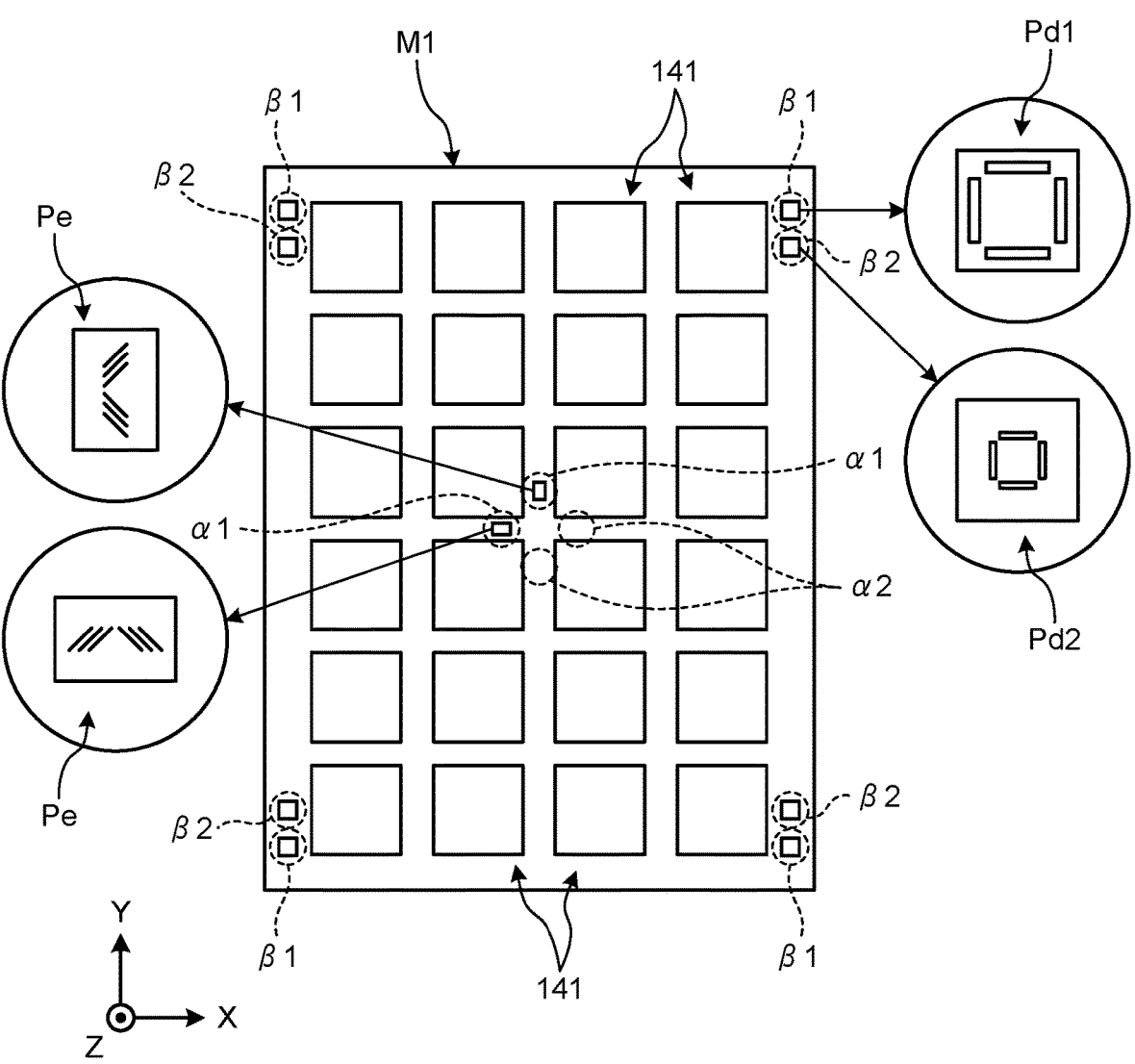
FIG. 6 is a plan view illustrating an example of a structure of a first mask of the embodiment.

FIG. 6 is a plan view illustrating an example of a structure of a first mask M1 of the embodiment. The first mask M1 is formed so that one shot region Rs can be exposed at one time, and includes chip patterns 141, exposure alignment patterns Pe, first deviation measurement patterns Pd1, and second deviation measurement patterns Pd2. In each of the plurality of chip patterns 141, a device pattern of a semiconductor device formed in the chip region Rc (in the present embodiment, a pattern for forming a memory cell array of the semiconductor memory device 1, or the like) is formed.

The exposure alignment pattern Pe of the first mask M1 is a pattern for forming the exposure alignment mark Me, and is formed in a position corresponding to the first exposure alignment region α1 set in the shot region Rs. In the present embodiment, one exposure alignment pattern Pe is placed in each of positions corresponding to two first exposure alignment regions α1.

The first deviation measurement pattern Pd1 of the first mask M1 is a pattern for forming the first deviation measurement mark Md1, and is formed in a position corresponding to the first deviation measurement region β1 set in the shot region Rs. In the present embodiment, one first deviation measurement pattern Pd1 is placed in each of positions corresponding to four first deviation measurement regions β1. The second deviation measurement pattern Pd2 of the first mask M1 is a pattern for forming the second deviation measurement mark Md2, and is formed in a position corresponding to the second deviation measurement region β2 set in the shot region Rs. In the present embodiment, one second deviation measurement pattern Pd2 is placed in each of positions corresponding to four second deviation measurement regions β2.

Figure 7:
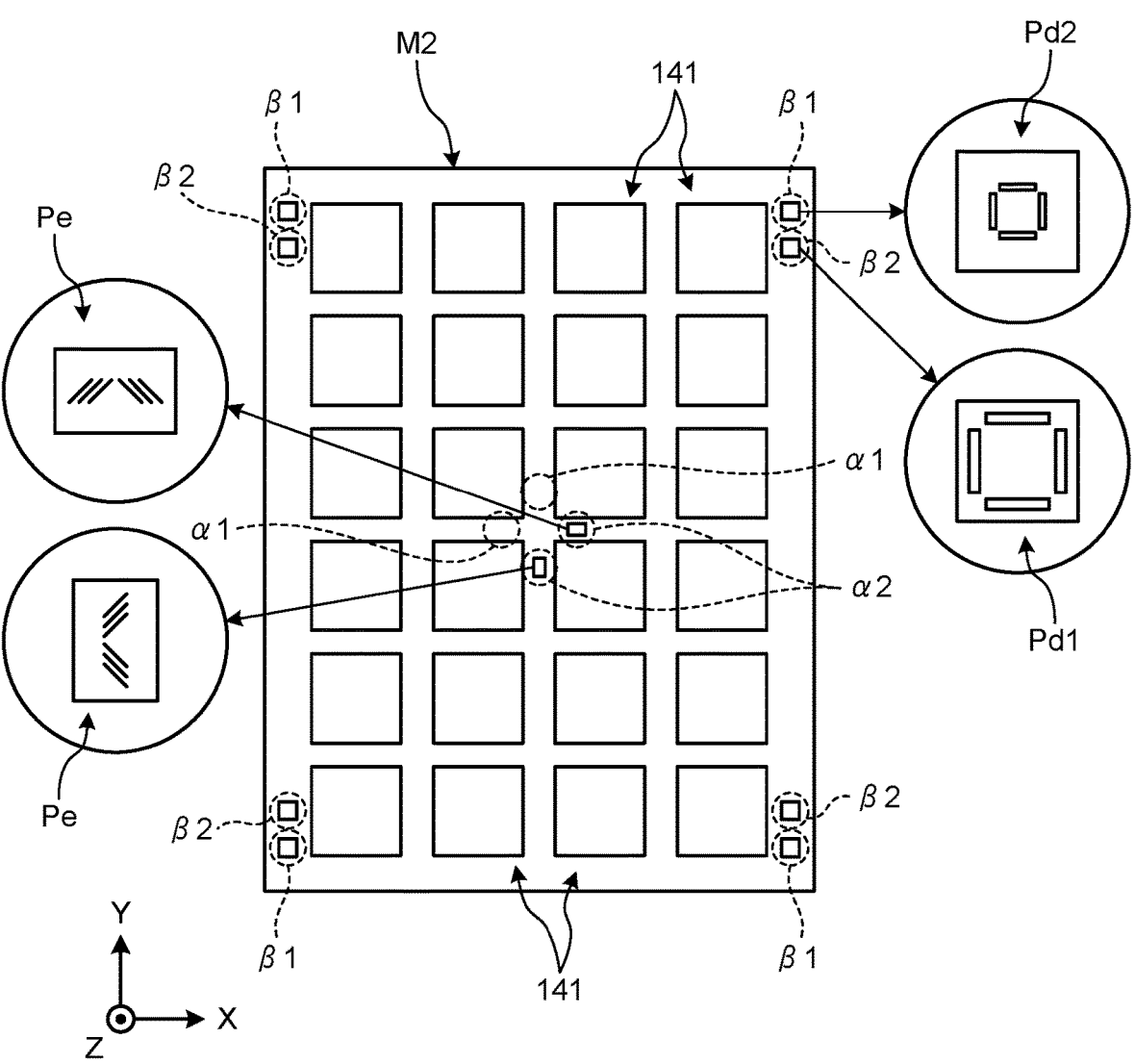
FIG. 7 is a plan view illustrating an example of a structure of a second mask of the embodiment.

FIG. 7 is a plan view illustrating an example of a structure of a second mask M2 of the embodiment. Similarly to the first mask M1, the second mask M2 is formed so that one shot region Rs can be exposed at one time, and includes chip patterns 141, exposure alignment patterns Pe, first deviation measurement patterns Pd1, and second deviation measurement patterns Pd2. In each of the plurality of chip patterns 141, a device pattern of a semiconductor device formed in the chip region Rc is formed like in the first mask M1.

The exposure alignment pattern Pe of the second mask M2 is a pattern for forming the exposure alignment mark Me, and is formed in a position corresponding to the second exposure alignment region α2 set in the shot region Rs. In the present embodiment, one exposure alignment pattern Pe is placed in each of positions corresponding to two second exposure alignment regions α2.

The first deviation measurement pattern Pd1 of the second mask M2 is a pattern for forming the first deviation measurement mark Md1, and is formed in a position corresponding to the second deviation measurement region β2 set in the shot region Rs. In the present embodiment, one first deviation measurement pattern Pd1 is placed in each of positions corresponding to four second deviation measurement regions β2. The second deviation measurement pattern Pd2 of the second mask M2 is a pattern for forming the second deviation measurement mark Md2, and is formed in a position corresponding to the first deviation measurement region β1 set in the shot region Rs. In the present embodiment, one second deviation measurement pattern Pd2 is placed in each of positions corresponding to four first deviation measurement regions β1.

In the present embodiment, when forming the stacked body L in six stages, the exposure alignment mark Me and the deviation measurement mark Md are formed by alternately using two kinds of masks like the above (the first mask M1 and the second mask M2) on a stage basis (the first story L1 to the sixth story L6). For example, the first mask M1 is used for exposure and development for the first story L1, the third story L3, and the fifth story L5, and the second mask M2 is used for exposure and development for the second story L2, the fourth story L4, and the sixth story L6. In the example in which marks are formed using the two kinds of masks M1 and M2 given as an example in the present embodiment, an example in which two exposure alignment marks and four deviation measurement marks are arranged has been described; however, the number of marks arranged increases or decreases according to the required alignment precision. For example, when high alignment precision is required, the number of parameters that can be corrected by the exposure device needs to be increased, but the necessary number of marks arranged increases as the number of parameters increases. There is also a case where the number of deviation measurement marks arranged exceeds ten.

FIG. 8 is a flowchart illustrating an example of part of processing in a method for manufacturing the semiconductor memory device 1 of the embodiment. First, a first story L1 is formed on a wafer W (an underlayer 101) by using an appropriate film forming technique, for example, CVD (chemical vapor deposition), PVD (physical vapor deposition), or the like (S101). After that, a first hard mask layer is formed on the first story L1 (S102), and a first resist pattern is formed on the first hard mask layer by using a first mask M1 (FIG. 6) (S103).

Figure 9A:
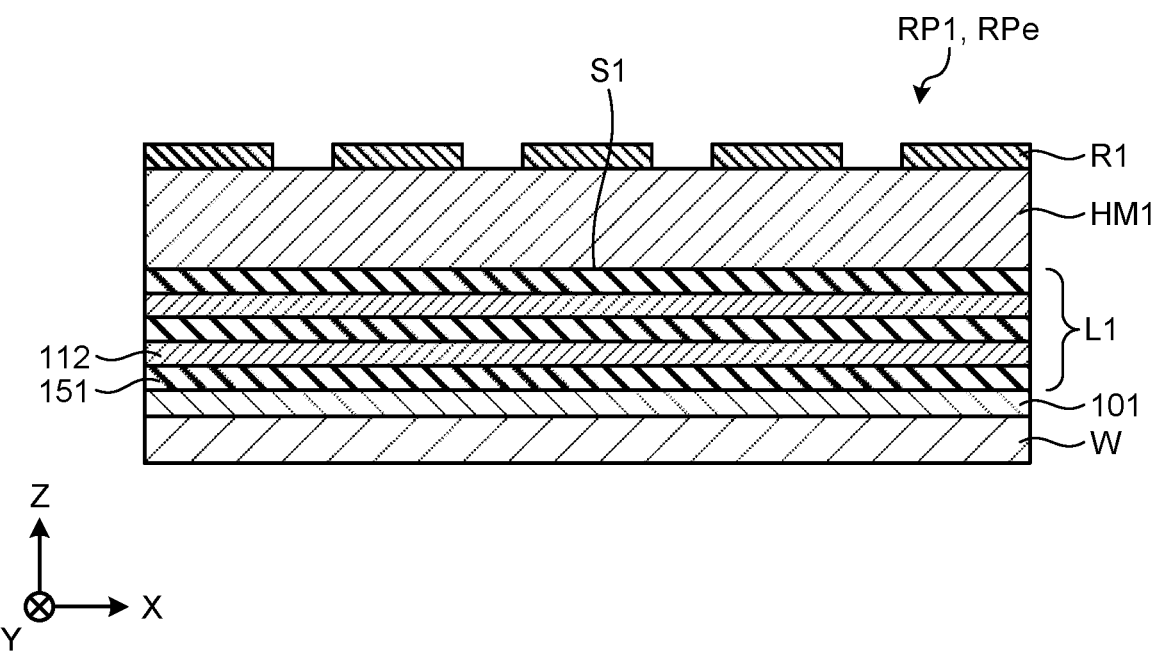
FIG. 9A is a cross-sectional view illustrating an example of a state of a first story, a first hard mask layer, and a first resist pattern in a first exposure alignment region of the embodiment.

FIG. 9A is a cross-sectional view illustrating an example of a state of the first story L1, the first hard mask layer HM1, and the first resist pattern RP1 in the first exposure alignment region α1 of the embodiment. FIG. 10A is a cross-sectional view illustrating an example of a state of the first story L1, the first hard mask layer HM1, and the first resist pattern RP1 in the first deviation measurement region β1 of the embodiment. FIG. 9A corresponds to the A-A cross section in FIG. 2. FIG. 10A corresponds to the B-B cross section in FIG. 2. Similarly to FIG. 9A, FIGS. 9B to 9K described later correspond to the A-A cross section in FIG. 2. similarly to FIG. 10A, FIGS. 10B to 10K described later correspond to the B-B cross section in FIG. 2.

As illustrated in FIGS. 9A and 10A, the first story L1 in the process of forming the stacked body L is configured by alternately stacking sacrificial layers 151 and insulating layers 112 on the underlayer 101. The sacrificial layer 151 will be finally replaced with a conductive layer 111 (FIG. 3). The first hard mask layer HM1 is formed on the uppermost surface S1 of the first story L1, and a first resist layer R1 having the first resist pattern RP1 obtained by exposure and development using the first mask M1 is formed on the first hard mask layer HM1.

As illustrated in FIG. 9A, in a portion of the first resist layer R1 corresponding to the first exposure alignment region α1, an exposure alignment resist pattern RPe is formed by the exposure alignment pattern Pe (FIG. 6) of the first mask M1.

As illustrated in FIG. 10A, in a portion of the first resist layer R1 corresponding to the first deviation measurement region β1, a first deviation measurement resist pattern RPd1 is formed by the first deviation measurement pattern Pd1 (FIG. 6) of the first mask M1. Although not illustrated, in a portion of the first resist layer R1 corresponding to the second deviation measurement region β2, a second deviation measurement resist pattern RPd2 is formed by the second deviation measurement pattern Pd2 of the first mask M1.

That is, the first resist pattern RP1 includes the exposure alignment resist pattern RPe formed in the first exposure alignment region α1, the first deviation measurement resist pattern RPd1 formed in the first deviation measurement region β1, and the second deviation measurement resist pattern RPd2 formed in the second deviation measurement region β2.

Returning to FIG. 8, after that, the first story L1 is processed with the first resist pattern RP1 formed on the first hard mask layer HM1 (S104).

Figure 9B:
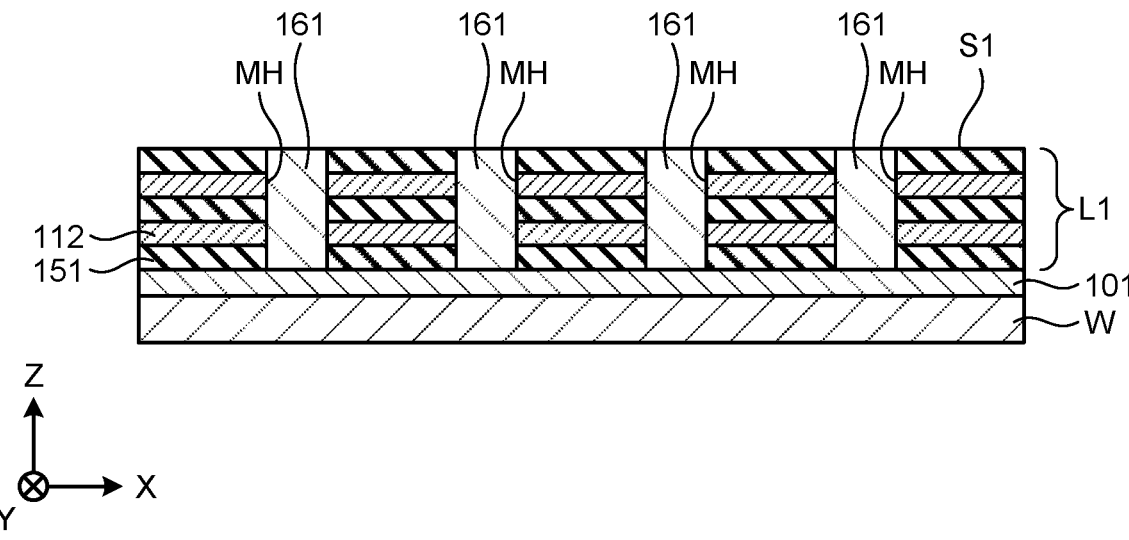
FIG. 9B is a cross-sectional view illustrating an example of a state of the first story after processing with the first resist pattern in the first exposure alignment region of the embodiment.
Figure 10A:
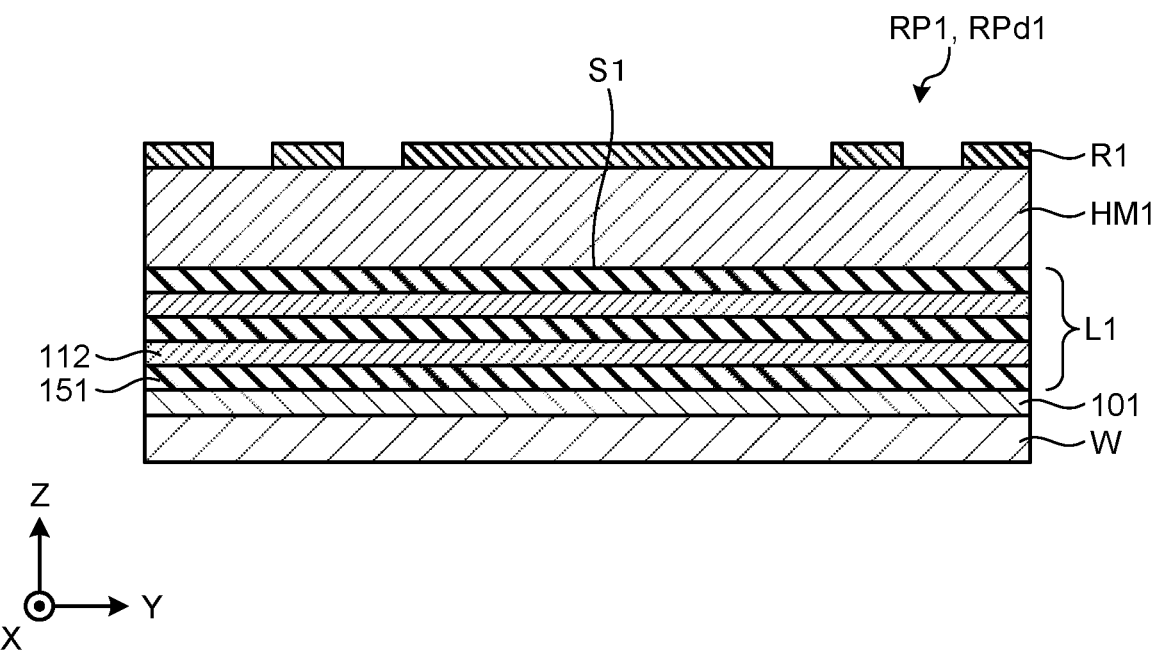
FIG. 10A is a cross-sectional view illustrating an example of a state of the first story, the first hard mask layer, and the first resist pattern in a first deviation measurement region of the embodiment.
Figure 10B:
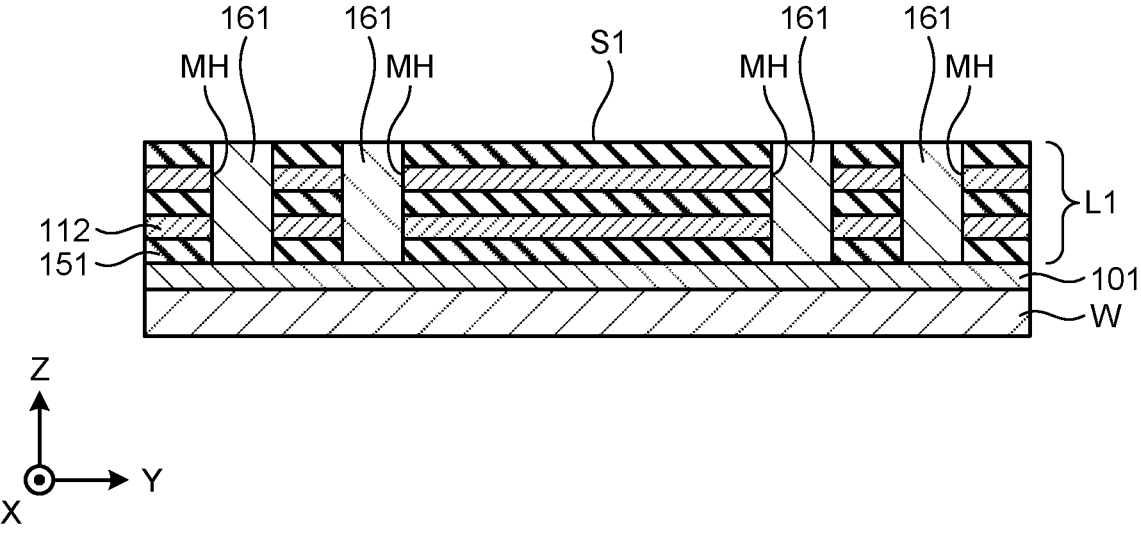
FIG. 10B is a cross-sectional view illustrating an example of a state of the first story after processing with the first resist pattern in the first deviation measurement region of the embodiment.

FIG. 9B is a cross-sectional view illustrating an example of a state of the first story L1 after processing with the first resist pattern RP1 in the first exposure alignment region α1 of the embodiment. FIG. 10B is a cross-sectional view illustrating an example of a state of the first story L1 after processing with the first resist pattern RP1 in the first deviation measurement region β1 of the embodiment.

As illustrated in FIG. 9B, in a portion of the first story L1 corresponding to the first exposure alignment region α1, the exposure alignment resist pattern RPe (FIG. 9A) is used to perform appropriate etching processing, for example, RIE (reactive ion etching) or the like, and thereby memory holes MH (an example of through holes) are formed. After that, a sacrificial layer 161 is formed in the memory hole MH by an appropriate film forming technique. The sacrificial layer 161 contains, for example, amorphous silicon or the like. Since the memory hole MH is not a portion that functions as a memory cell of the semiconductor memory device 1 unlike the memory hole MH formed in the chip region Rc (FIG. 3), a pillar layer may not be formed in the interior of the above memory hole MH.

As illustrated in FIG. 10B, in a portion of the first story L1 corresponding to the first deviation measurement region β1, the first deviation measurement resist pattern RPd1 (FIG. 10A) is used to perform appropriate etching processing, and thereby memory holes MH are formed. After that, a sacrificial layer 161 is formed in the memory hole MH by an appropriate film forming technique. At this time, although not illustrated, in the second deviation measurement region β2, memory holes MH are formed in a portion of the first story L1 corresponding to the second deviation measurement region β2 by using the second deviation measurement resist pattern, and a sacrificial layer is formed in the memory hole MH. The formation of the memory hole MH in the second deviation measurement region β2 will be described later with reference to FIG. 10F, etc.

Returning to FIG. 8, after that, exposure alignment level differences and deviation measurement level differences are formed on the uppermost surface S1 of the first story L1 (S105).

Figure 9C:
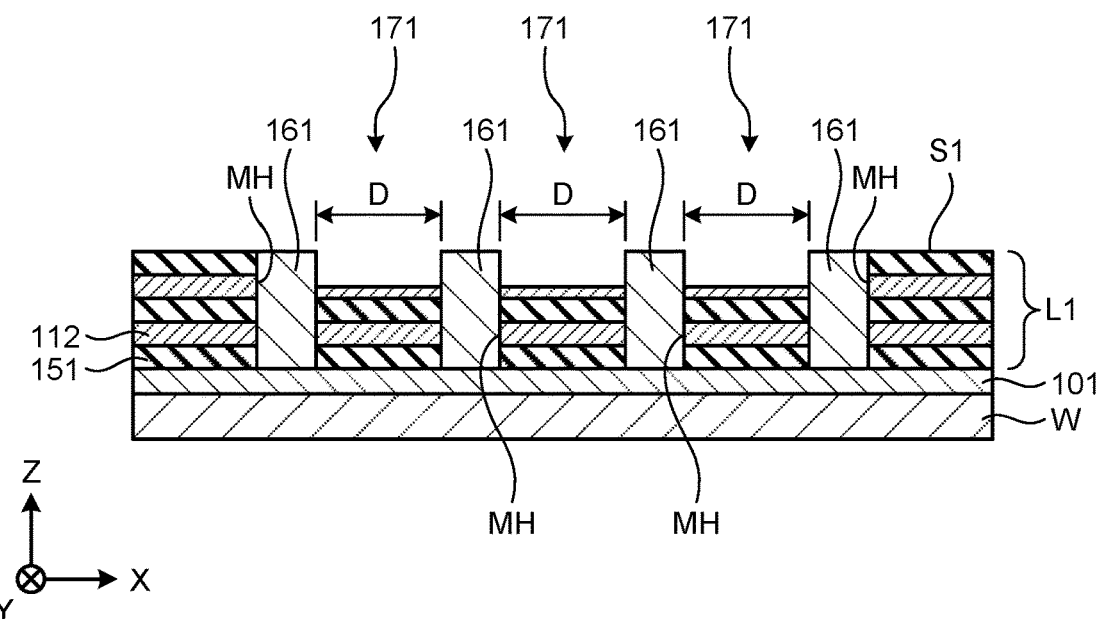
FIG. 9C is a cross-sectional view illustrating an example of exposure alignment level differences of the first story of the embodiment.
Figure 10C:
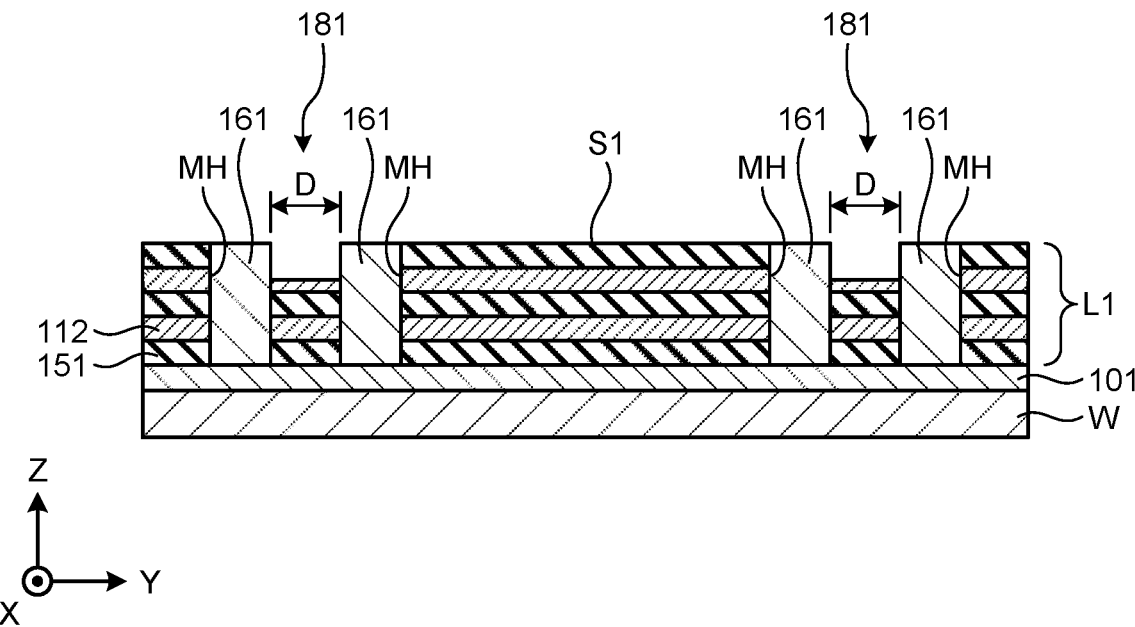
FIG. 10C is a cross-sectional view illustrating an example of deviation measurement level differences of the first story of the embodiment.

FIG. 9C is a cross-sectional view illustrating an example of exposure alignment level differences 171 of the first story L1 of the embodiment. FIG. 10C is a cross-sectional view illustrating an example of deviation measurement level differences 181 of the first story L1 of the embodiment.

As illustrated in FIG. 9C, exposure alignment level differences 171 corresponding to the exposure alignment mark Me are formed with reference to the memory hole MH formed in the first exposure alignment region α1 as described above. The exposure alignment level difference 171 is formed by removing an upper portion of the first story L1 existing between memory holes MH by an appropriate technique such as etching. Although herein an example in which the entire uppermost sacrificial layer 151 and part of the insulating layer 112 immediately below the sacrificial layer 151 are removed is illustrated, the thickness of the layer removed is not limited thereto. The width D of the exposure alignment level difference 171 (the gap between adjacent memory holes MH) is preferably in the range of 1 μm to 4 μm.

As illustrated in FIG. 10C, deviation measurement level differences 181 corresponding to the first deviation measurement mark Md1 are formed with reference to the memory hole MH formed in the first deviation measurement region β1 as described above. The deviation measurement level difference 181 is formed by removing an upper portion of the first story L1 existing between the two memory holes MH located on the outsides by an appropriate technique such as etching. Although herein an example in which the entire uppermost sacrificial layer 151 and part of the insulating layer 112 immediately below the sacrificial layer 151 are removed is illustrated, the thickness of the layer removed is not limited thereto. Similarly to the width D of the exposure alignment level difference 171, the width D of the deviation measurement level difference 181 is preferably in the range of 1 μm to 4 μm.

Returning to FIG. 8, after that, a second story L2 is formed on the first story L1 (S106).

Figure 9D:
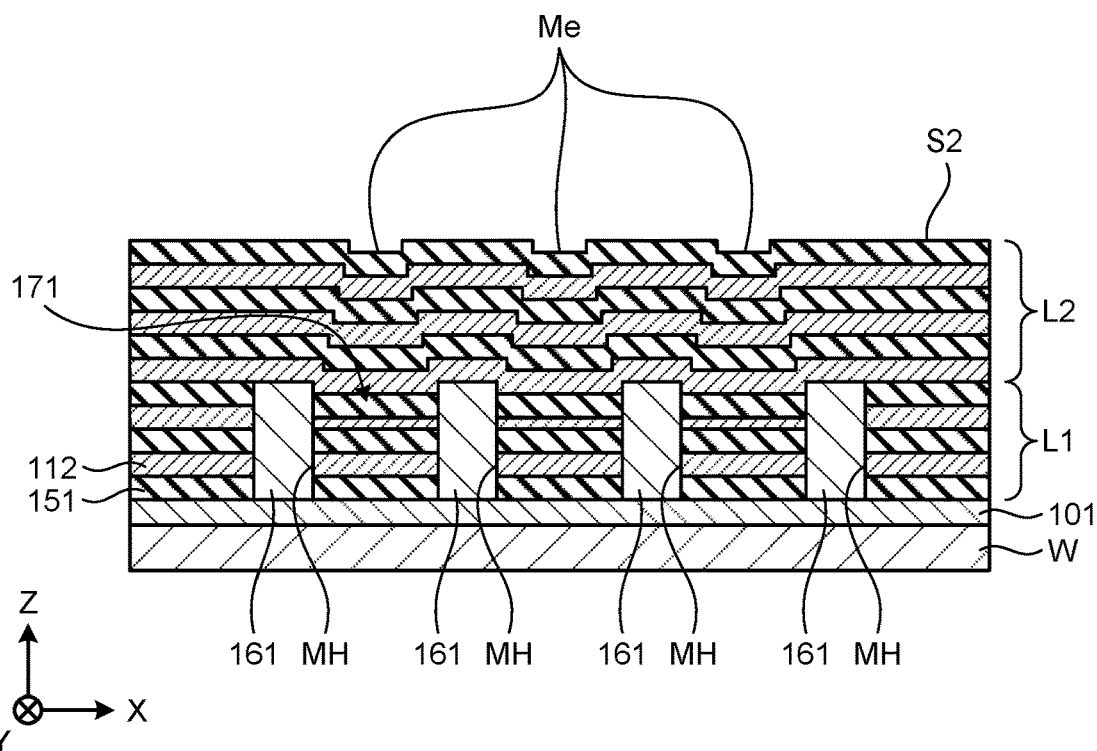
FIG. 9D is a cross-sectional view illustrating an example of a state of a second story in the first exposure alignment region of the embodiment.
Figure 10D:
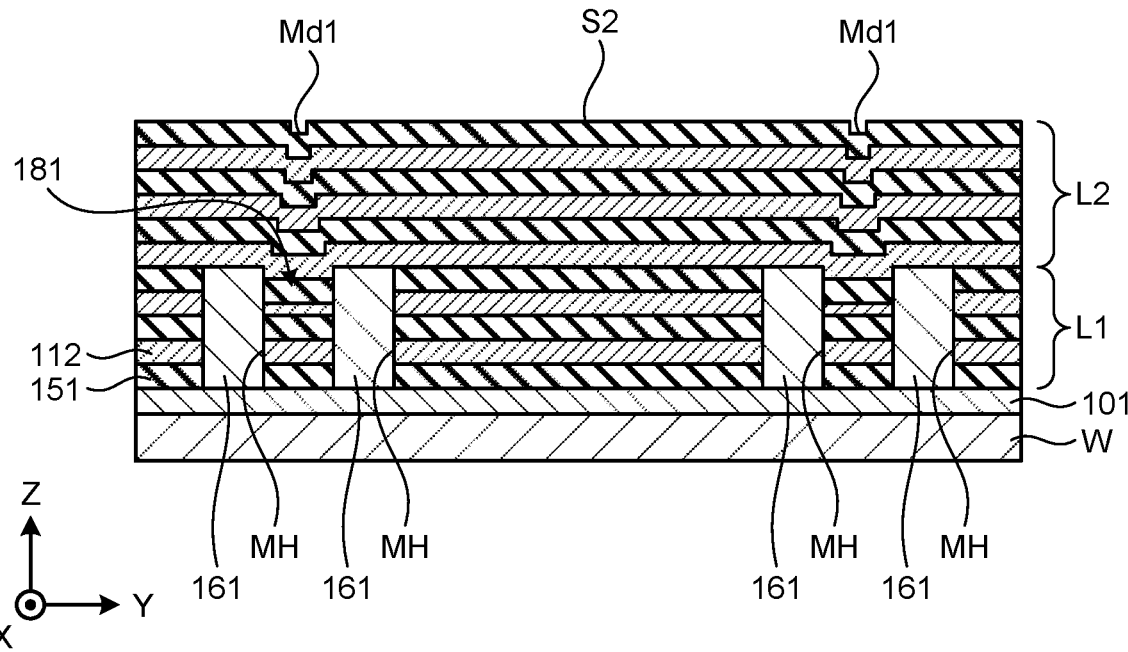
FIG. 10D is a cross-sectional view illustrating an example of a state of the second story in the first deviation measurement region of the embodiment.

FIG. 9D is a cross-sectional view illustrating an example of a state of the second story L2 in the first exposure alignment region α1 of the embodiment. FIG. 10D is a cross-sectional view illustrating an example of a state of the second story L2 in the first deviation measurement region β1 of the embodiment.

As illustrated in FIGS. 9D and 10D, the second story L2 in the process of forming the stacked body L is configured by alternately stacking sacrificial layers 151 and insulating layers 112 similarly to the first story L1. Although the sacrificial layer 151 in the chip region Rc will be finally replaced with a conductive layer 111 (FIG. 3), the sacrificial layer 151 in the dicing region Rd may be replaced with a conductive layer 111 or may not be replaced.

As illustrated in FIG. 9D, a second story L2 in which sacrificial layers 151 and insulating layers 112 are alternately stacked is formed on the first story L1 by an appropriate film forming technique. At this time, the exposure alignment level difference 171 formed on the first story L1 propagates to the uppermost surface S2 of the second story L2, and thereby an exposure alignment mark Me is formed on the uppermost surface S2 of the second story L2 in the first exposure alignment region α1.

As illustrated in FIG. 10D, when the second story L2 is being formed on the first story L1, the deviation measurement level difference 181 formed on the first story L1 propagates to the uppermost surface S2 of the second story L2, and thereby a first deviation measurement mark Md1 is formed on the uppermost surface S2 of the second story L2 in the first deviation measurement region β1.

Returning to FIG. 8, after that, a second hard mask layer is formed on the second story L2 (S107), and a second resist pattern is formed on the second hard mask layer by using a second mask M2 (FIG. 7) (S108).

Figure 9E:
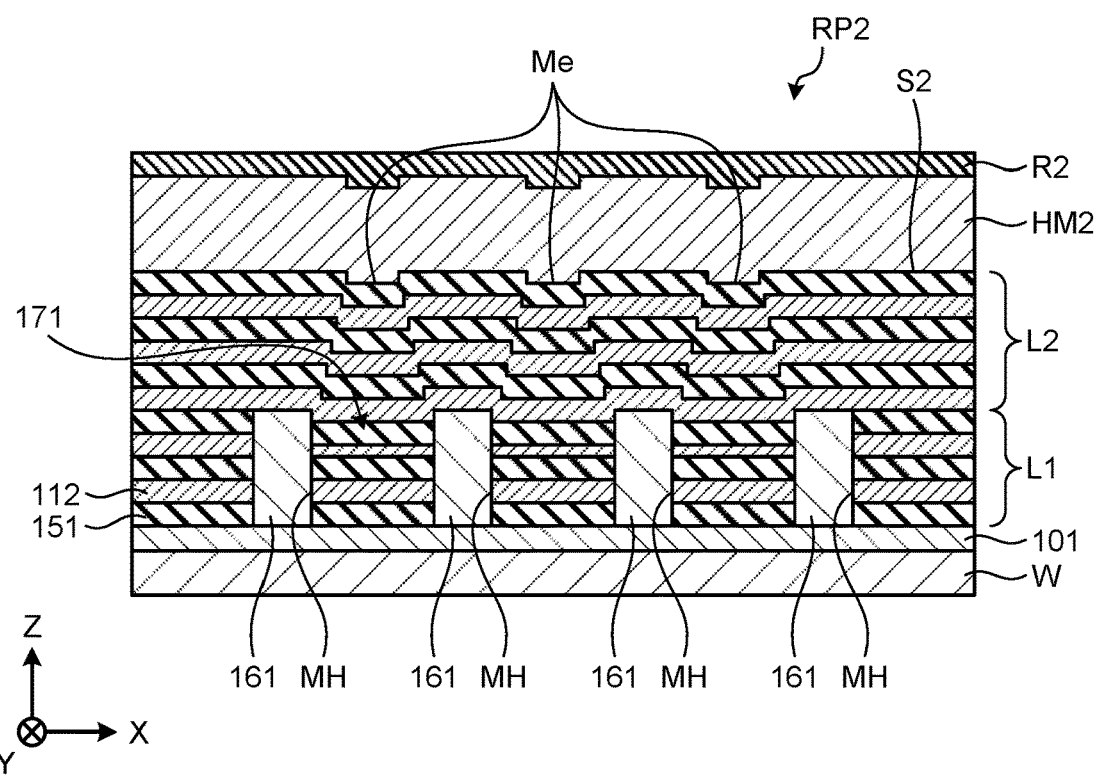
FIG. 9E is a cross-sectional view illustrating an example of a state of the second story, a second hard mask layer, and a second resist pattern in the first exposure alignment region of the embodiment.
Figure 10E:
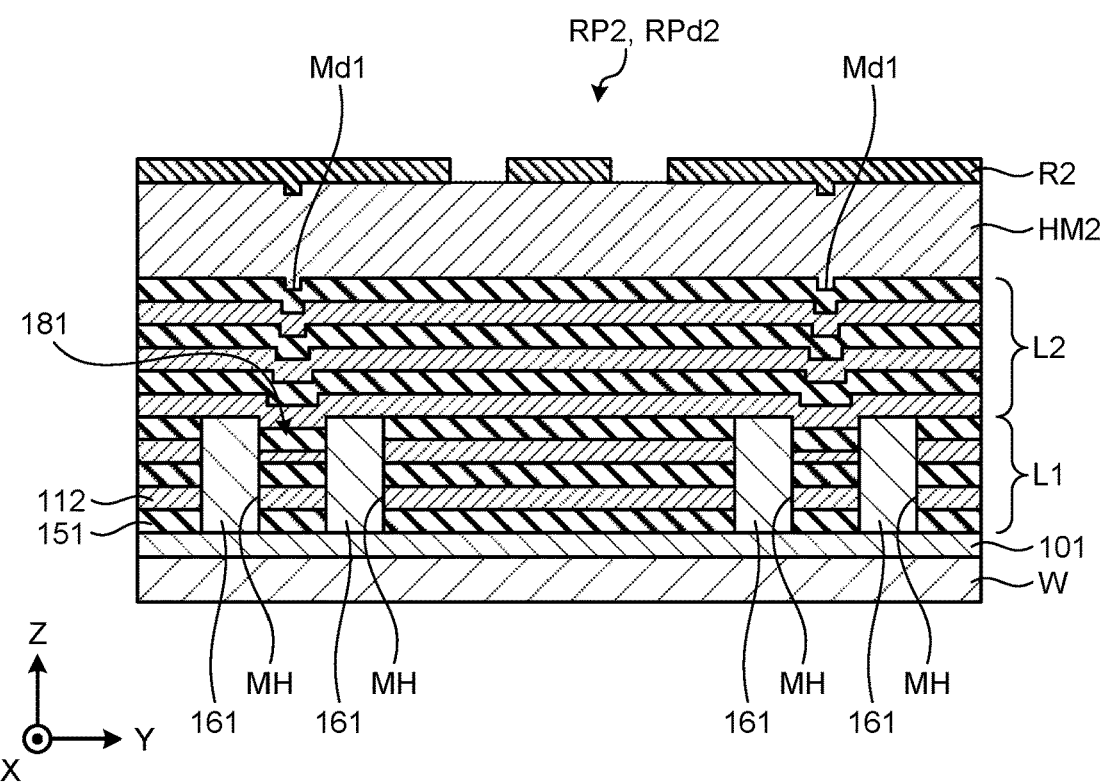
FIG. 10E is a cross-sectional view illustrating an example of a state of the second story, the second hard mask layer, and the second resist pattern in the first deviation measurement region of the embodiment.

FIG. 9E is a cross-sectional view illustrating an example of a state of the second story L2, the second hard mask layer HM2, and the second resist pattern RP2 in the first exposure alignment region α1 of the embodiment. FIG. 10E is a cross-sectional view illustrating an example of a state of the second story L2, the second hard mask layer HM2, and the second resist pattern PR2 in the first deviation measurement region β1 of the embodiment.

As illustrated in FIGS. 9E and 10E, the second hard mask layer HM2 is formed on the uppermost surface S2 of the second story L2, and a second resist layer R2 having the second resist pattern RP2 obtained by exposure and development using the second mask M2 (FIG. 7) is formed on the second hard mask layer HM2.

As illustrated in FIG. 9E, in a portion of the second resist layer R2 corresponding to the first exposure alignment region α1, an exposure alignment resist pattern RPe, which is formed in the first resist layer R1 (FIG. 9A), is not formed. This is because, as illustrated in FIG. 7, no exposure alignment pattern Pe is formed in the first exposure alignment region α1 of the second mask M2. On the other hand, since an exposure alignment pattern Pe is formed in the second exposure alignment region α2 of the second mask M2, although not illustrated, an exposure alignment resist pattern RPe is formed in a portion of the second resist layer R2 corresponding to the second exposure alignment region α2.

As illustrated in FIG. 10E, a second deviation measurement resist pattern RPd2 is formed in a portion of the second resist layer R2 corresponding to the first deviation measurement region β1. Although not illustrated, a first deviation measurement resist pattern RPd1 (FIG. 10A) is formed in a portion of the second resist layer R2 corresponding to the second deviation measurement region β2. The second deviation measurement resist pattern RPd2 and the first deviation measurement resist pattern RPd1 correspond to the second deviation measurement pattern Pd2 and the first deviation measurement pattern Pd1 (FIG. 7) included in the second mask M2, respectively.

That is, the second resist pattern RP2 includes the exposure alignment resist pattern RPe formed in the second exposure alignment region α2, the second deviation measurement resist pattern RPd2 formed in the first deviation measurement region β1, and the first deviation measurement resist pattern RPd1 formed in the second deviation measurement region β2.

Returning to FIG. 8, after that, the second story L2 is processed with the second resist pattern RP2 formed on the second hard mask layer HM2 (S109).

Figure 9F:
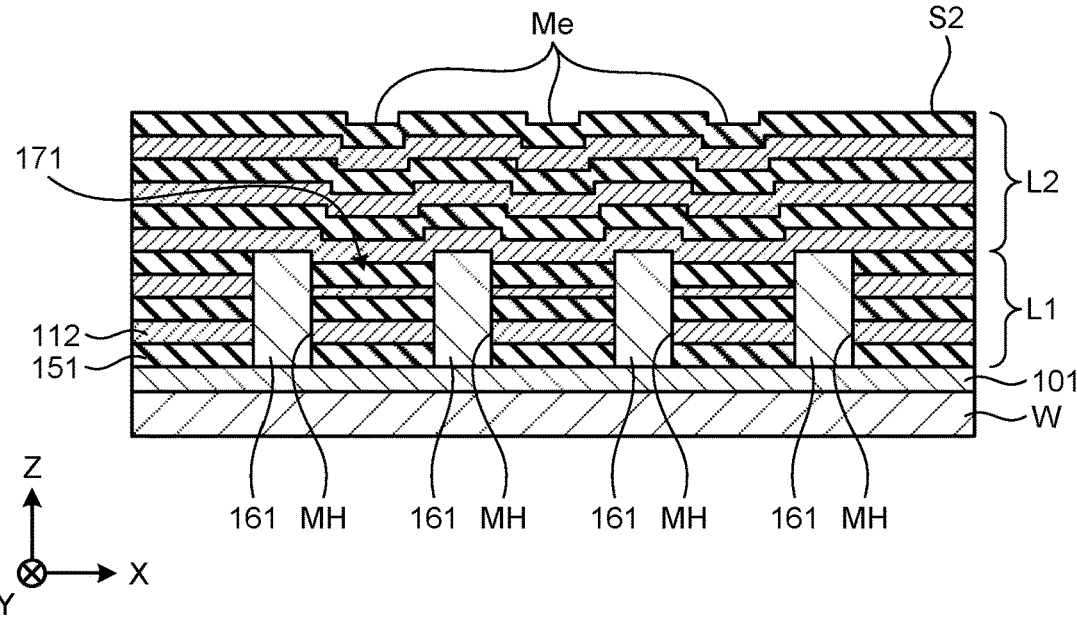
FIG. 9F is a cross-sectional view illustrating an example of a state of the second story after processing with the second resist pattern in the first exposure alignment region of the embodiment.
Figure 10F:
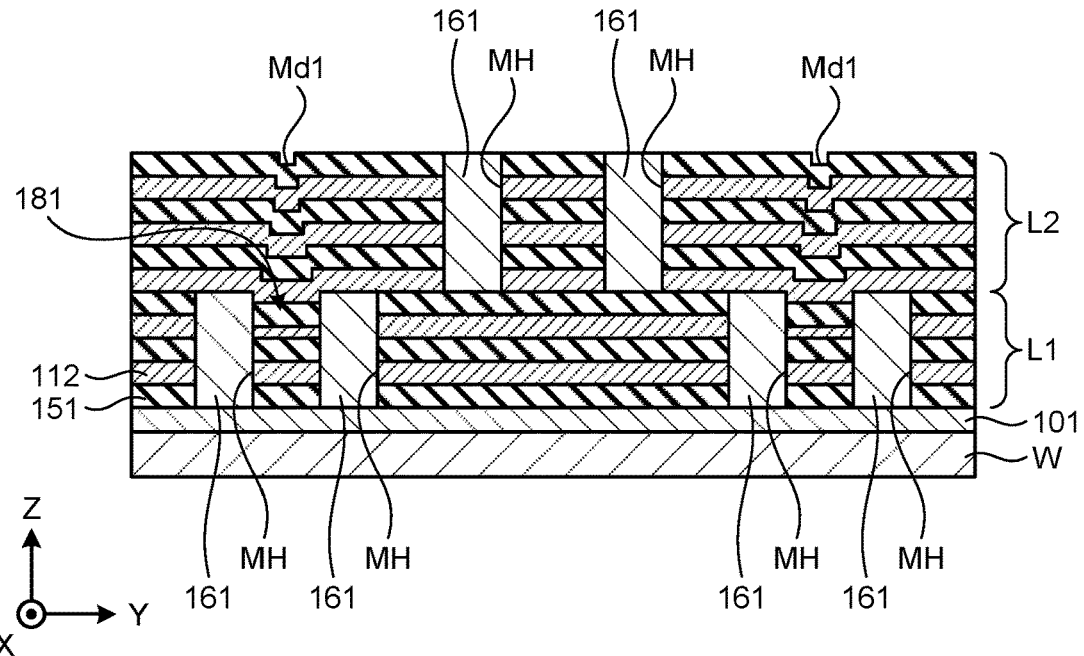
FIG. 10F is a cross-sectional view illustrating an example of a state of the second story after processing with the second resist pattern in the first deviation measurement region of the embodiment.

FIG. 9F is a cross-sectional view illustrating an example of a state of the second story L2 after processing with the second resist pattern RP2 in the first exposure alignment region α1 of the embodiment. FIG. 10F is a cross-sectional view illustrating an example of a state of the second story L2 after processing with the second resist pattern RP2 in the first deviation measurement region β1 of the embodiment.

As described above, in the second resist pattern RP2, since no exposure alignment resist pattern RPe is formed in the first exposure alignment region α1, as illustrated in FIG. 9F, a portion of the second story L2 corresponding to the first exposure alignment region α1 has experienced only removal of the second hard mask layer HM2 and the second resist layer R2, and has nothing formed.

On the other hand, the second deviation measurement resist pattern RPd2 (FIG. 10E) is formed in the first deviation measurement region β1 of the second resist pattern. Therefore, as illustrated in FIG. 10F, memory holes MH are formed in a portion of the second story L2 corresponding to the first deviation measurement region β1 by using the second deviation measurement resist pattern RPd2 to perform appropriate etching processing, and then sacrificial layers 161 are formed.

Returning to FIG. 8, after that, exposure alignment level differences and deviation measurement level differences are formed on the uppermost surface S2 of the second story L2 (S110). At this time, in the present embodiment, exposure alignment level differences 171 like those illustrated in FIG. 9C are formed in the second exposure alignment region α2, and deviation measurement level differences 181 like those illustrated in FIG. 10C are formed in the second deviation measurement region β2.

After that, a third story L3 is formed on the second story L2 (S111).

Figure 9G:
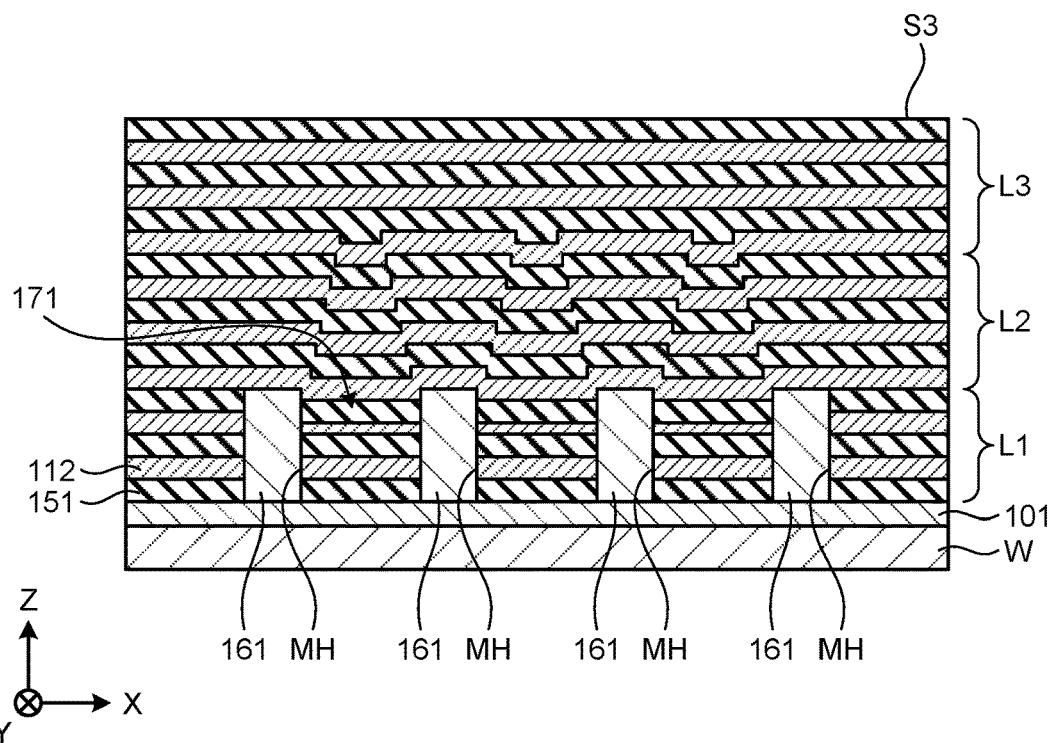
FIG. 9G is a cross-sectional view illustrating an example of a state of a third story in the first exposure alignment region of the embodiment.
Figure 10G:
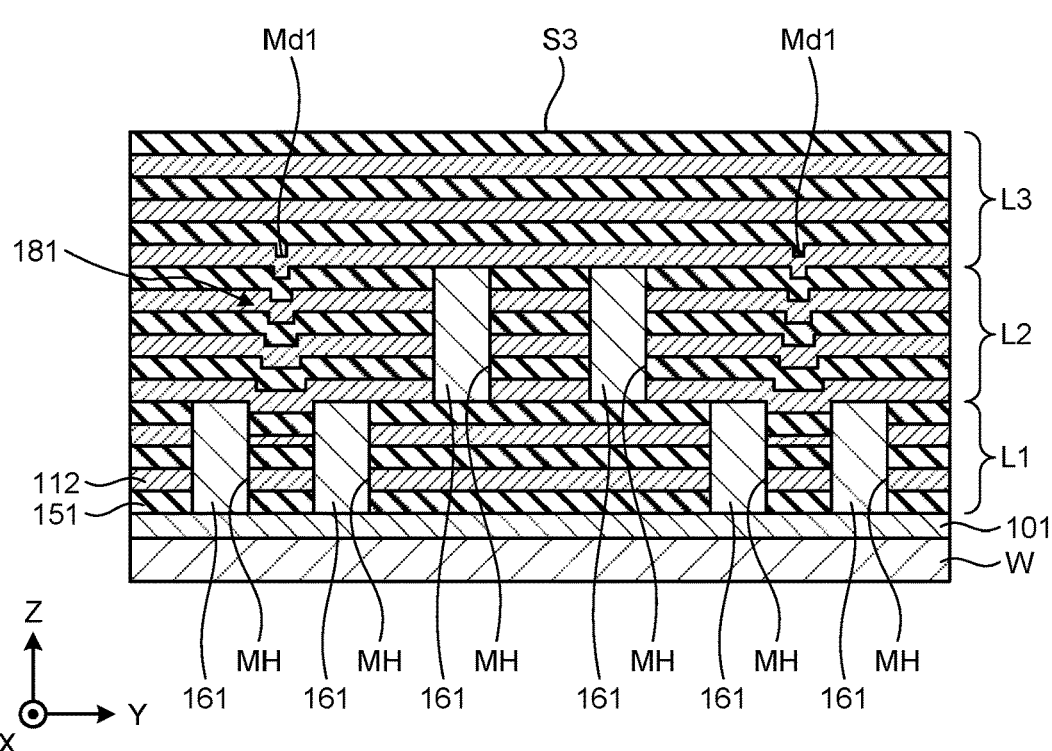
FIG. 10G is a cross-sectional view illustrating an example of a state of the third story in the first deviation measurement region of the embodiment.

FIG. 9G is a cross-sectional view illustrating an example of a state of the third story L3 in the first exposure alignment region α1 of the embodiment. FIG. 10G is a cross-sectional view illustrating an example of a state of the third story L3 in the first deviation measurement region β1 of the embodiment.

As illustrated in FIG. 9G, a third story L3 in which sacrificial layers 151 and insulating layers 112 are alternately stacked is formed on the second story L2 by an appropriate film forming technique. At this time, the exposure alignment level difference 171 formed in the first story L1 does not propagate to the uppermost surface S3 of the third story L3. That is, the exposure alignment level difference 171 of the N-th story (for example, the first story L1) is formed to propagate up to the uppermost surface (for example, the uppermost surface S2) of the (N+1)-th story (for example, the second story L2) and not to propagate to the uppermost surface (for example, the uppermost surface S3) of the (N+2)-th story (for example, the third story L3).

As illustrated in FIG. 10G, when the third story L3 is formed on the second story L2, the deviation measurement level difference 181 formed on the first story L1 does not propagate to the uppermost surface S3 of the third story L3.

That is, similarly to the exposure alignment level difference 171, the deviation measurement level difference 181 of the N-th story (for example, the first story L1) of the present embodiment is formed to propagate up to the uppermost surface (for example, the uppermost surface S2) of the (N+1)-th story (for example, the second story L2) and not to propagate to the uppermost surface (for example, the uppermost surface S3) of the (N+2)-th story (for example, the third story L3).

Returning to FIG. 8, after that, a third hard mask layer is formed on the third story L3 (S112), and a first resist pattern RP1 is formed on the third hard mask layer by using a first mask M1 (FIG. 6) (S113).

Figure 9H:
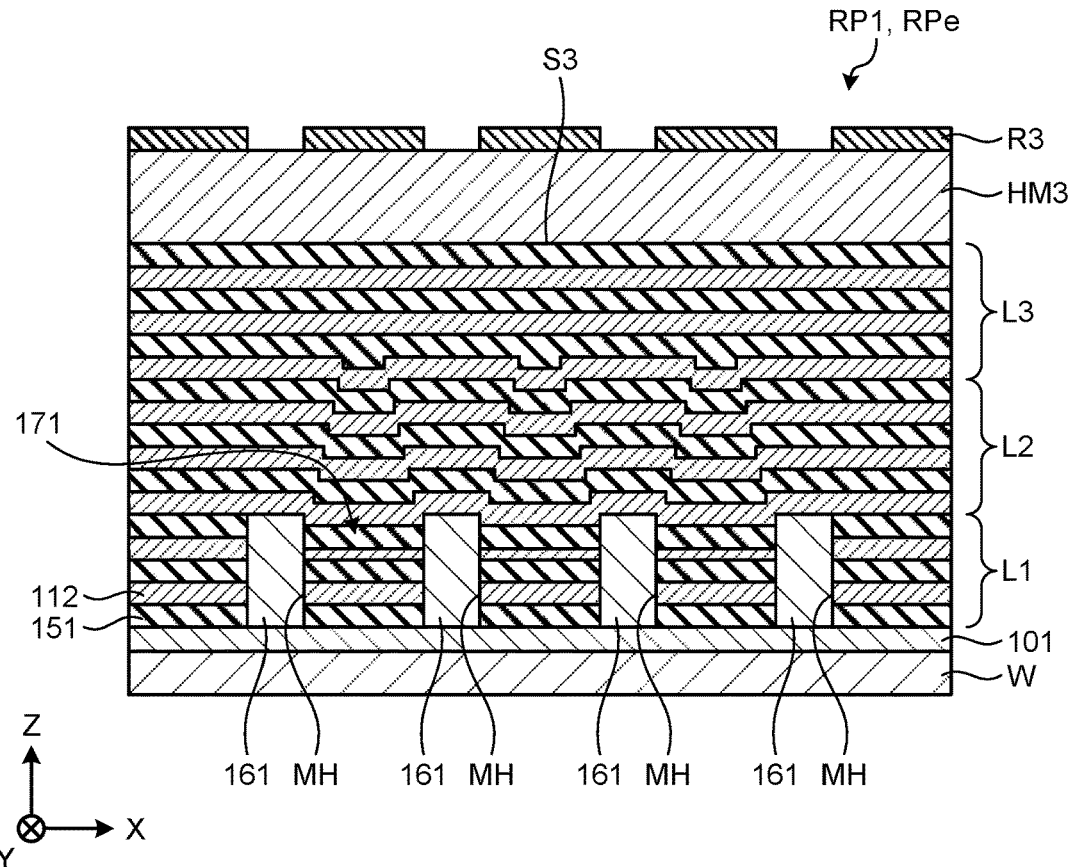
FIG. 9H is a cross-sectional view illustrating an example of a state of the third story, a third hard mask layer, and the first resist pattern in the first exposure alignment region of the embodiment.
Figure 10H:
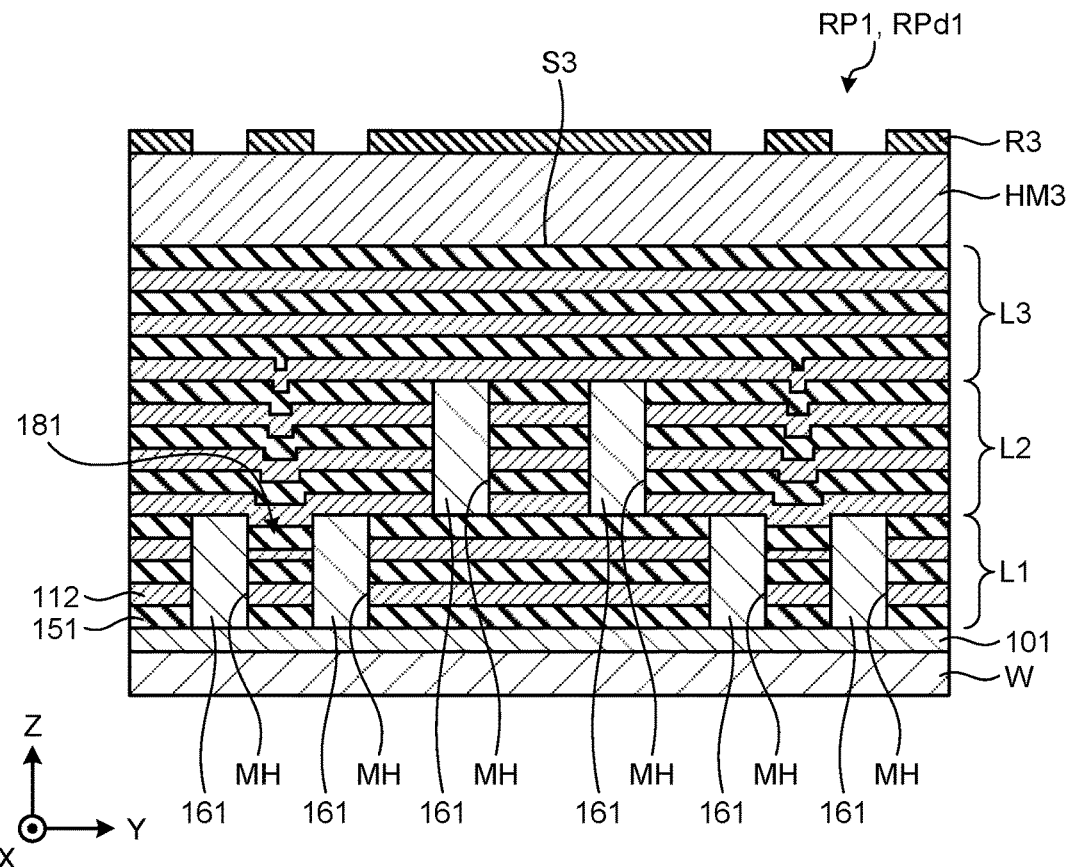
FIG. 10H is a cross-sectional view illustrating an example of a state of the third story, the third hard mask layer, and the first resist pattern in the first deviation measurement region of the embodiment.

FIG. 9H is a cross-sectional view illustrating an example of a state of the third story L3, the third hard mask layer HM3, and the first resist pattern RP1 in the first exposure alignment region α1 of the embodiment. FIG. 10H is a cross-sectional view illustrating an example of a state of the third story L3, the third hard mask layer HM3, and the first resist pattern RP1 in the first deviation measurement region β1 of the embodiment.

As illustrated in FIGS. 9H and 10H, the third hard mask layer HM3 is formed on the uppermost surface S3 of the third story L3, and a third resist layer R3 having the first resist pattern RP1 obtained by exposure and development using the first mask M1 is formed on the third hard mask layer HM3.

As illustrated in FIG. 9H, in a portion of the third resist layer R3 corresponding to the first exposure alignment region α1, an exposure alignment resist pattern RPe is formed by the exposure alignment pattern Pe of the first mask M1.

As illustrated in FIG. 10H, in a portion of the third resist layer R3 corresponding to the first deviation measurement region β1, a first deviation measurement resist pattern RPd1 is formed by the first deviation measurement pattern Pd1 of the first mask M1. Although not illustrated, in a portion of the third resist layer R3 corresponding to the second deviation measurement region β2, a second deviation measurement resist pattern RPd2 is formed by the second deviation measurement pattern Pd2 of the first mask M1.

That is, the first resist pattern RP1 on the third story L3 is formed using a first mask M1 common to the first story L1. At this time, since the exposure alignment level difference 171 and the deviation measurement level difference 181 formed on the first story L1 do not propagate to the uppermost surface S3 of the third story L3, they do not interfere with the first resist pattern RP1 on the third story L3.

Returning to FIG. 8, after that, the third story L3 is processed with the first resist pattern RP1 formed on the third hard mask layer HM3 (S114).

Figure 9I:
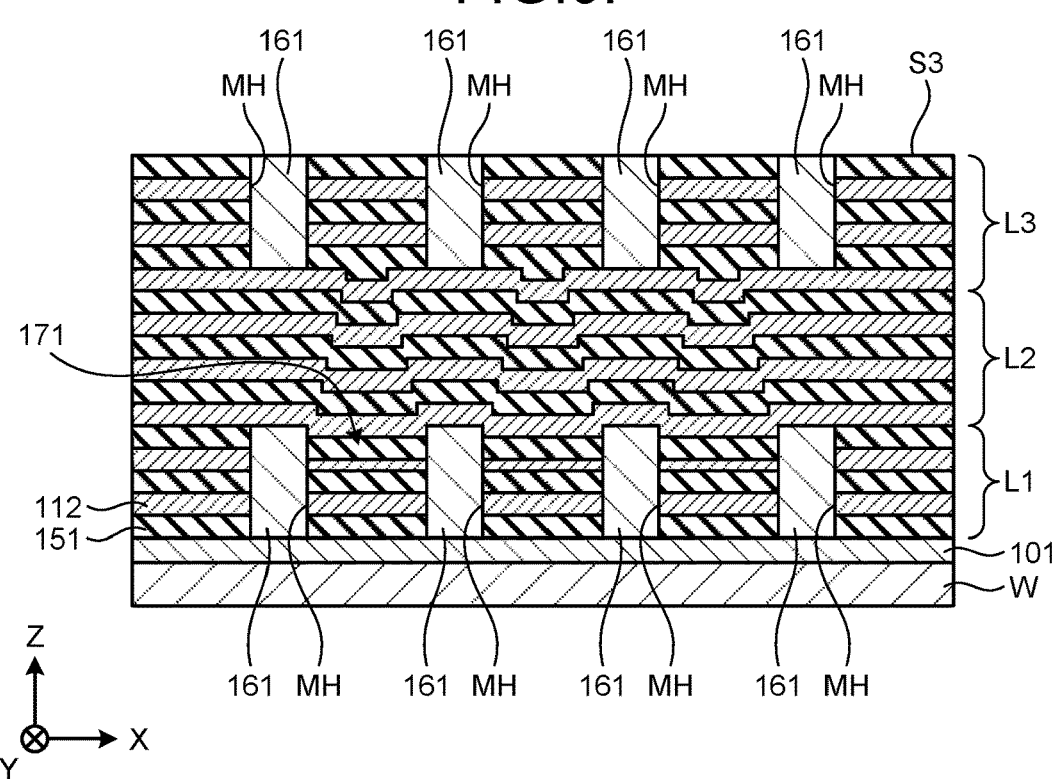
FIG. 9I is a cross-sectional view illustrating an example of a state of the third story after processing with the first resist pattern in the first exposure alignment region of the embodiment.
Figure 10I:
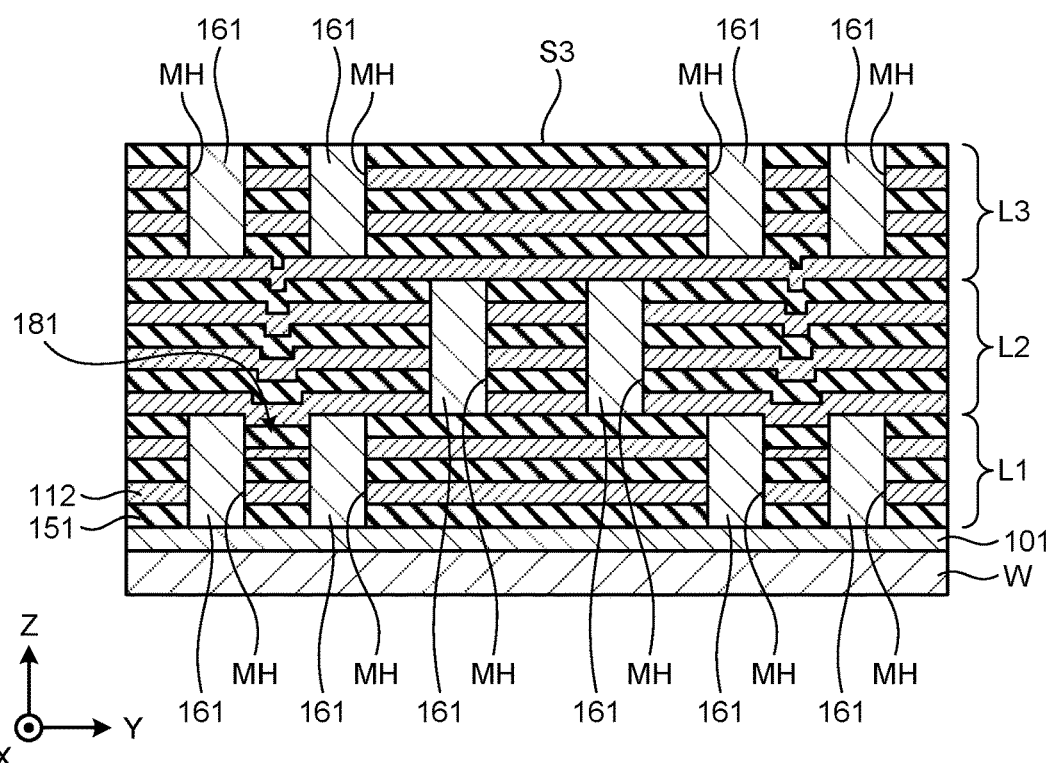
FIG. 10I is a cross-sectional view illustrating an example of a state of the third story after processing with the first resist pattern in the first deviation measurement region of the embodiment.

FIG. 9I is a cross-sectional view illustrating an example of a state of the third story L3 after processing with the first resist pattern RP1 in the first exposure alignment region α1 of the embodiment. FIG. 10I is a cross-sectional view illustrating an example of a state of the third story L3 after processing with the first resist pattern RP1 in the first deviation measurement region β1 of the embodiment.

As illustrated in FIG. 9I, in a portion of the third story L3 corresponding to the first exposure alignment region α1, the exposure alignment resist pattern RPe (FIG. 9H) is used to perform appropriate etching processing, and thereby memory holes MH similar to those of the first story L1 are formed. After that, a sacrificial layer 161 is formed in the memory hole MH by an appropriate film forming technique.

As illustrated in FIG. 10I, in a portion of the third story L3 corresponding to the first deviation measurement region β1, memory holes MH similar to those of the first story L1 are formed by using the first deviation measurement resist pattern RPd1 (FIG. 10H) to perform appropriate etching processing, and then a sacrificial layer 161 is formed in the memory hole MH by an appropriate film forming technique. At this time, although not illustrated, in the second deviation measurement region β2, memory holes MH are formed in a portion of the third story L3 corresponding to the second deviation measurement region β2 by using the second deviation measurement resist pattern, and a sacrificial layer 161 is formed in the memory hole MH.

Returning to FIG. 8, after that, exposure alignment level differences and deviation measurement level differences are formed on the uppermost surface S3 of the third story L3 (S115).

Figure 9J:
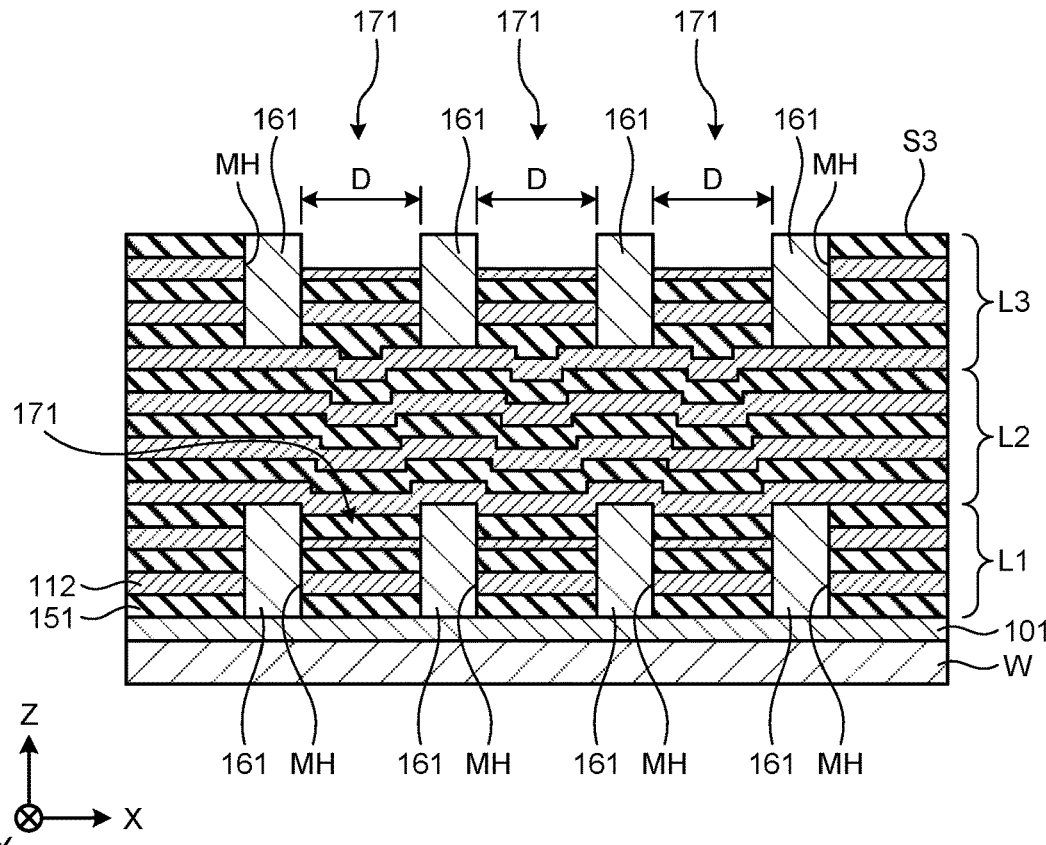
FIG. 9J is a cross-sectional view illustrating an example of exposure alignment level differences of the third story of the embodiment.
Figure 10J:
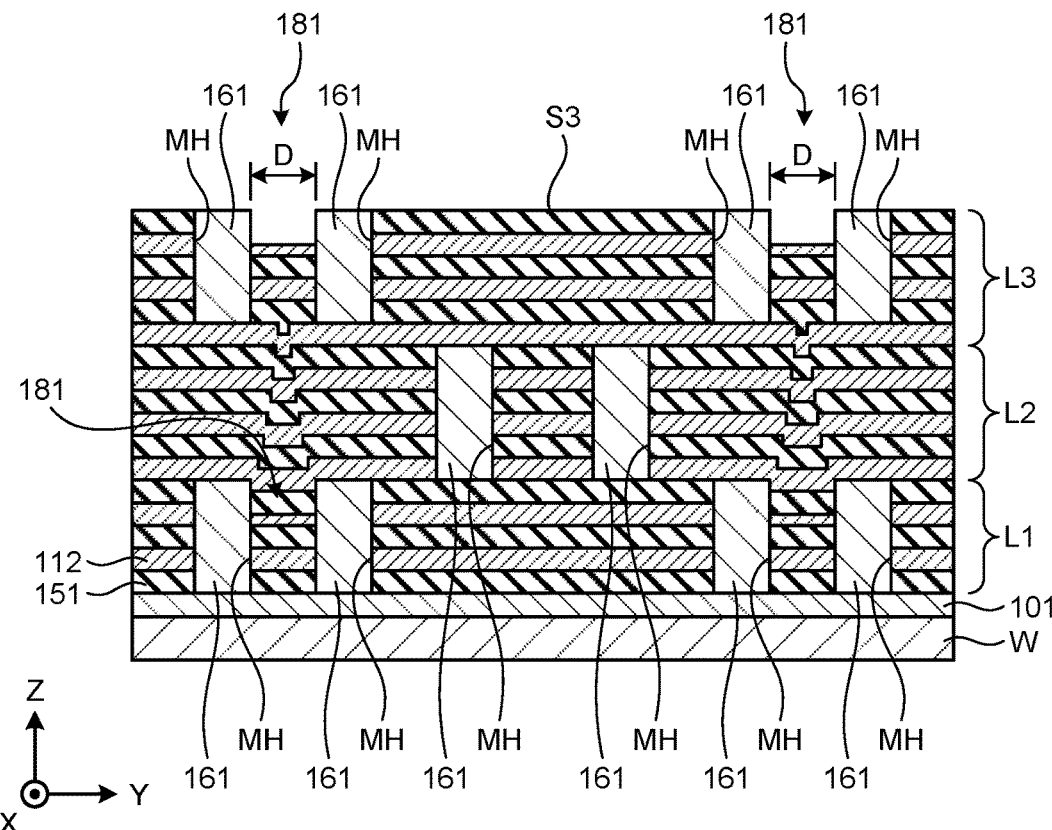
FIG. 10J is a cross-sectional view illustrating an example of deviation measurement level differences of the third story of the embodiment.

FIG. 9J is a cross-sectional view illustrating an example of exposure alignment level differences 171 of the third story L3 of the embodiment. FIG. 10J is a cross-sectional view illustrating an example of deviation measurement level differences 181 of the third story of the embodiment.

As illustrated in FIG. 9J, like in the first story L1, exposure alignment level differences 171 corresponding to the exposure alignment mark Me are formed with reference to the memory hole MH formed in the first exposure alignment region α1 of the third story L3.

As illustrated in FIG. 10J, like in the first story L1, deviation measurement level differences 181 corresponding to the first deviation measurement mark Md1 are formed with reference to the memory hole MH formed in the first deviation measurement region β1 of the third story L3.

Returning to FIG. 8, after that, a fourth story L4 is formed on the third story L3 (S116), a fourth hard mask layer is formed on the fourth story L4 (S117), and a second resist pattern RP2 is formed on the fourth hard mask layer by using a second mask M2 (S118). After that, the fourth story L4 is processed with the second resist pattern RP2 formed on the fourth hard mask layer (S119), and exposure alignment level differences 171 and deviation measurement level differences 181 are formed on the uppermost surface of the fourth story L4 (S120). The steps of S116 to S120 are performed similarly to the steps of S106 to S110 described above.

After that, a fifth story L5 is formed on the fourth story L4 (S121), a fifth hard mask layer is formed on the fifth story L5 (S122), and a first resist pattern RP1 is formed on the fifth hard mask layer by using a first mask M1 (S123). After that, the fifth story L5 is processed with the first resist pattern RP1 formed on the fifth hard mask layer (S124), and exposure alignment level differences 171 and deviation measurement level differences 181 are formed on the uppermost surface of the fifth story L5 (S125). The steps of S121 to S125 are performed similarly to the steps of S111 to S115 described above.

After that, a sixth story L6 is formed on the fifth story L5 (S126), a sixth hard mask layer is formed on the sixth story L6 (S127), and a second resist pattern RP2 is formed on the sixth hard mask layer by using a second mask M2 (S128). After that, the sixth story L6 is processed with the second resist pattern RP2 formed on the sixth hard mask layer (S129). The steps of S126 to S129 are performed similarly to the steps of S106 to S109 described above (the step of forming the second story L2).

Figure 9K:
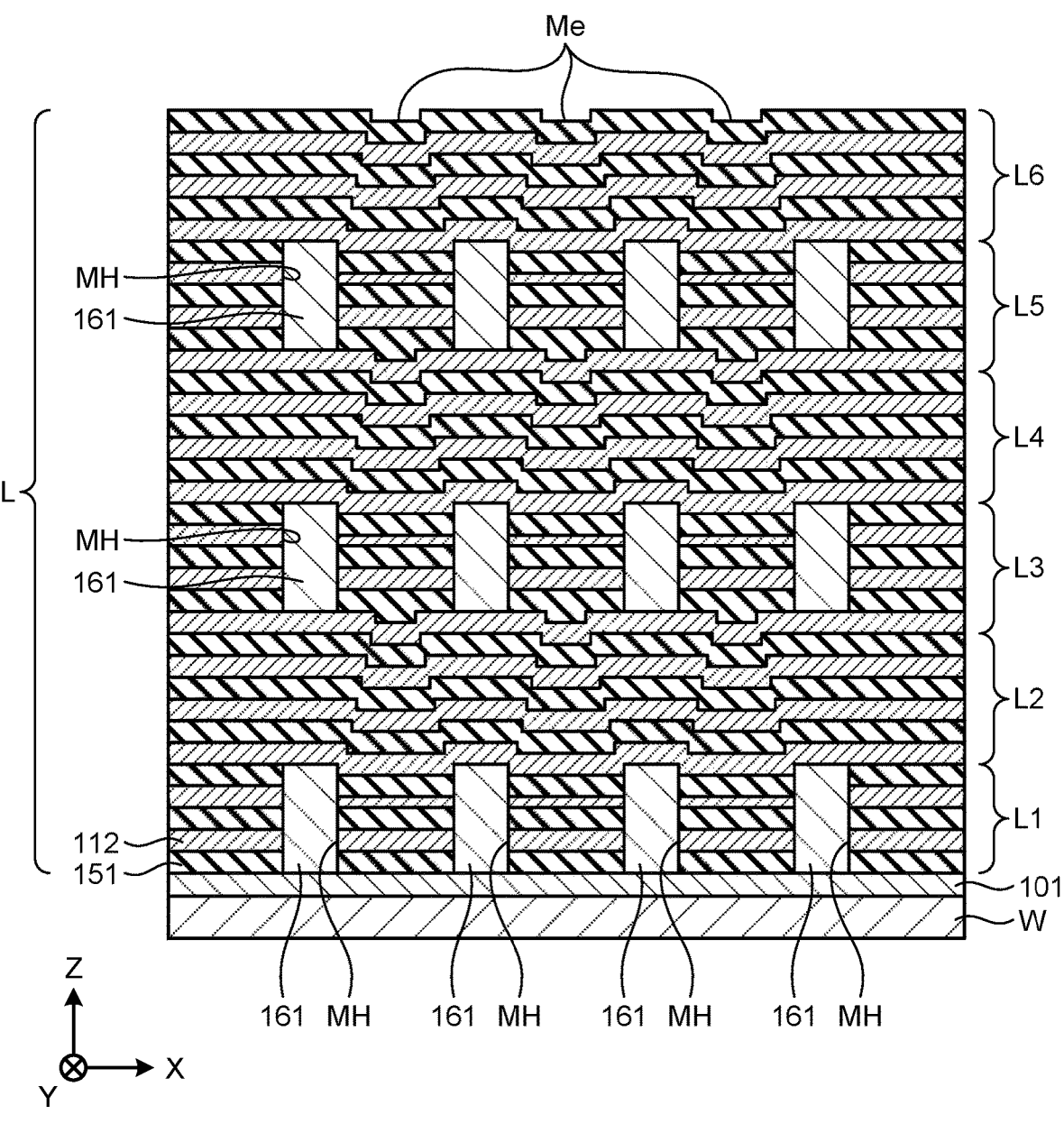
FIG. 9K is a cross-sectional view illustrating an example of a configuration of a stacked body in the first exposure alignment region of the embodiment.
Figure 10K:
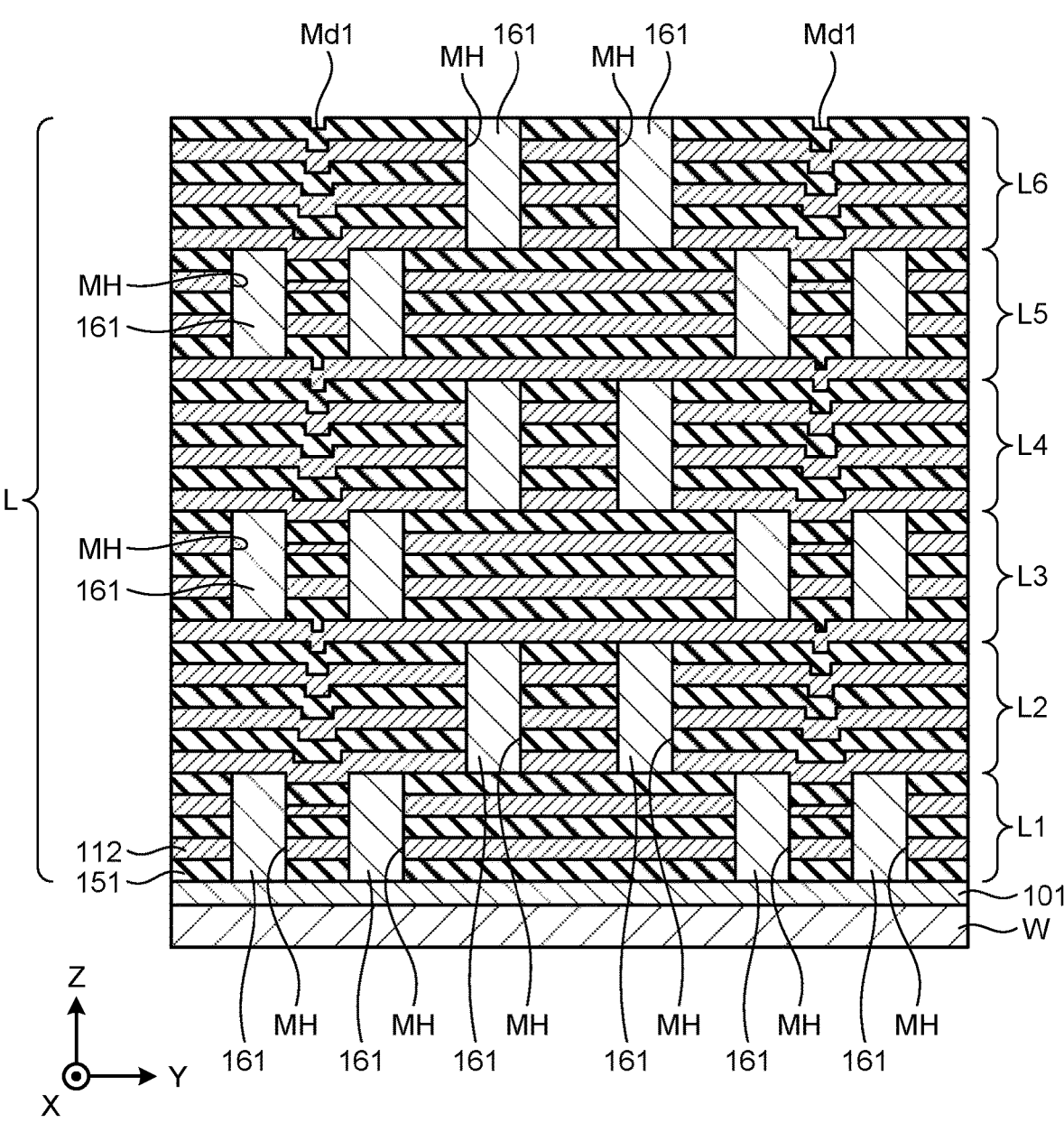
FIG. 10K is a cross-sectional view illustrating an example of a configuration of a stack body in the first deviation measurement region of the embodiment.

FIG. 9K is a cross-sectional view illustrating an example of a configuration of a stacked body L in the first exposure alignment region α1 of the embodiment. FIG. 10K is a cross-sectional view illustrating an example of a configuration of a stacked body L in the first deviation measurement region β1 of the embodiment. FIG. 9K illustrates a state of a stacked body L in which the stacking of the first story L1 to the sixth story L6 in the first exposure alignment region α1 is completed. FIG. 10K illustrates a state of a stacked body L in which the stacking of the first story L1 to the sixth story L6 in the first deviation measurement region β1 is completed.

As illustrated in FIG. 9K, the first exposure alignment region α1 is in a state where memory holes MH are formed in the odd-numbered stories (the first story L1, the third story L3, and the fifth story L5) and no memory holes MH are formed in the even-numbered stories (the second story L2, the fourth story L4, and the sixth story L6). Although not illustrated, the second exposure alignment region α2 is, conversely, in a state where memory holes MH are formed in the even-numbered stories (the second story L2, the fourth story L4, and the sixth story L6) and no memory holes MH are formed in the odd-numbered stories (the first story L1, the third story L3, and the fifth story L5).

Figure 11:
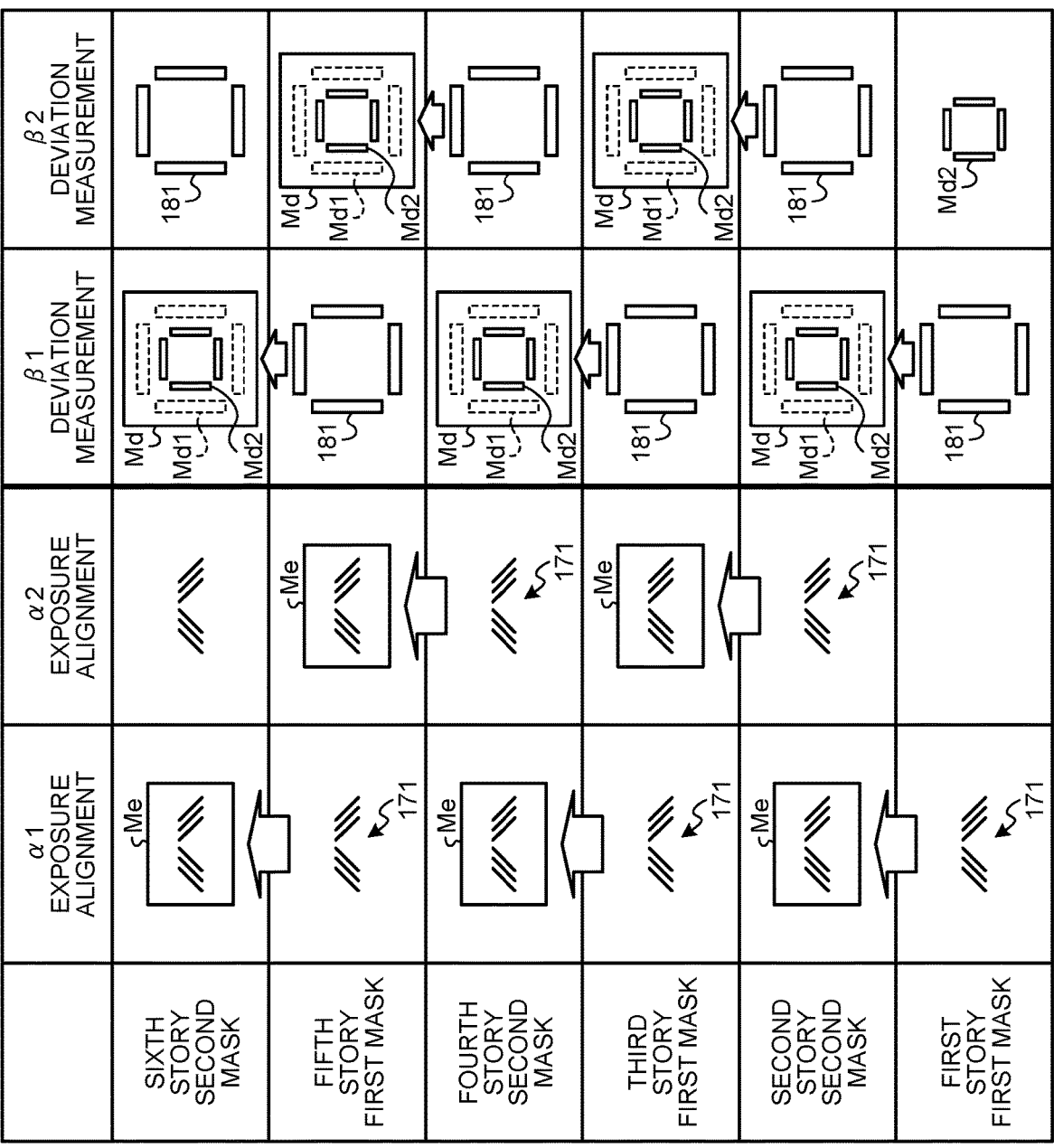
FIG. 11 is a diagram conceptually illustrating an example of exposure alignment processing and deviation measurement processing of the embodiment.

FIG. 11 is a diagram conceptually illustrating an example of exposure alignment processing and deviation measurement processing of the embodiment. As illustrated in FIG. 11, exposure alignment processing is performed using an exposure alignment mark Me formed by exposure alignment level differences 171 formed on the layer under a target story being propagated to the uppermost surface of the target story. That is, the exposure alignment mark Me used for exposure alignment processing performed on the second story L2 is formed by a process in which exposure alignment level differences 171 formed in the first exposure alignment region α1 of the first story L1 by using the first mask M1 propagate to the uppermost surface S2 of the second story L2. The exposure alignment mark Me used for exposure alignment processing performed on the third story L3 is formed by a process in which exposure alignment level differences 171 formed in the second exposure alignment region α2 of the second story L2 by using the second mask M2 propagate to the uppermost surface S3 of the third story L3. After that, the processing is repeated up to the uppermost story (in the present embodiment, the sixth story L6).

As above, in the present embodiment, the exposure alignment level difference 171 formed on the N-th story is formed to propagate up to the uppermost surface of the (N+1)-th story and not to propagate to the uppermost surface of the (N+2)-th story. This can be achieved by, for example, designing the above width D (FIGS. 9C and 9J) within a predetermined range (for example, 1 μm to 4 μm). Thus, the exposure alignment mark Me can be formed by using two kinds of masks M1 and M2 every other story in turn. That is, the first mask M1 is used on the first story L1, the third story L3, and the fifth story L5, and the second mask M2 is used on the second story L2, the fourth story L4, and the sixth story L6 (or vice versa). Thereby, the cost, working time, etc. required for manufacturing, replacement, etc. of the mask for forming the exposure alignment mark Me can be reduced. In addition, the exposure alignment mark Me can be formed on every other story in an identical exposure alignment region α1 or α2. Thereby, the area to be secured for exposure alignment processing can be reduced, and miniaturization, improvement in productivity, etc. can be achieved.

Further, deviation measurement processing is performed using a deviation measurement mark Md including a first deviation measurement mark Md1 formed by deviation measurement level differences 181 formed on the layer under a target story being propagated to the uppermost surface of the target story and a second deviation measurement mark Md2 formed on the target story (for example, a second deviation measurement pattern Pd2 formed on a resist layer). That is, the deviation measurement mark Md used for deviation measurement processing performed on the second story L2 is formed by a first deviation measurement mark Md1 formed by a process in which deviation measurement level differences 181 formed in the first deviation measurement region β1 of the first story L1 by using the first mask M1 propagate to the uppermost surface S2 of the second story L2 and a second deviation measurement mark Md2 formed in the first deviation measurement region β1 of the second story L2 by using the second mask M2. The deviation measurement mark Md used for deviation measurement processing performed on the third story L3 is formed by a first deviation measurement mark Md1 formed by a process in which deviation measurement level differences 181 formed in the second deviation measurement region β2 of the second story L2 by using the second mask M2 propagate to the uppermost surface S3 of the third story L3 and a second deviation measurement mark Md2 formed in the second deviation measurement region β2 of the second story L2 by using the first mask M1. After that, the processing is repeated up to the uppermost story (in the present embodiment, the sixth story L6).

As above, in the present embodiment, the deviation measurement level difference 181 formed on the N-th story is formed to propagate up to the uppermost surface of the (N+1)-th story and not to propagate to the uppermost surface of the (N+2)-th story. This can be achieved by, for example, designing the above width D (FIGS. 10C and 10J) within a predetermined range (for example, 1 μm to 4 μm). Thus, the deviation measurement mark Md can be formed by using two kinds of masks M1 and M2 every other story in turn. That is, the first mask M1 is used on the first story L1, the third story L3, and the fifth story L5, and the second mask M2 is used on the second story L2, the fourth story L4, and the sixth story L6 (or vice versa). Thereby, the cost, working time, etc. required for manufacturing, replacement, etc. of the mask for forming the deviation measurement mark Md can be reduced. In addition, the deviation measurement mark Md can be formed on every other story in an identical deviation measurement region β1 or β2. Thereby, the area to be secured for deviation measurement processing can be reduced, and miniaturization, improvement in productivity, etc. can be achieved.

As above, according to the present embodiment, the exposure alignment mark Me or the deviation measurement mark Md can be efficiently formed on a stacked body L divided into three or more stories by using the two kinds of masks M1 and M2. In addition, in the interior of the stacked body L, in a region (for example, the first exposure alignment region α1) corresponding to an identical pair of coordinates in a planar (XY-planar) coordinate system intersecting the stacking direction (the Z direction), a plurality of identical alignment marks (for example, exposure alignment marks Me) are formed in every other story. Thereby, alignment processing when forming a stacked body in a plurality of stages can be efficiently performed.

First Modification Example

In the above embodiment, a configuration is described in which, in order to form an exposure alignment mark Me and a deviation measurement mark Md, two kinds of masks (a first mask M1 and a second mask M2) are used, and two kinds of exposure alignment regions α1 and α2 and two kinds of deviation measurement regions β1 and β2 are used. However, the kind of the mask, the kind of the exposure alignment region, and the kind of the deviation measurement region are not limited to the above. In the present modification example, a configuration is described in which three kinds of masks are used, and three kinds of exposure alignment regions and three kinds of deviation measurement regions are used.

Figure 12:
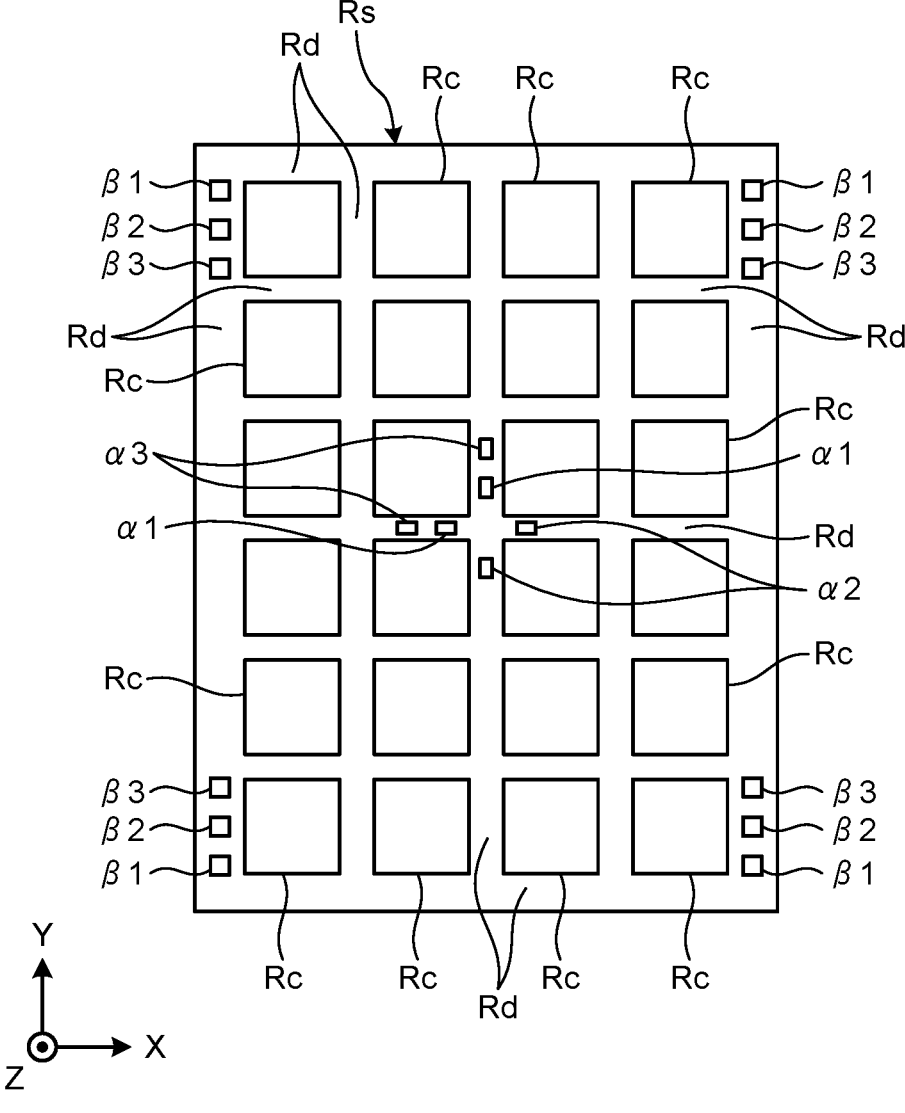
FIG. 12 is a plan view illustrating an example of a configuration of a shot region of a first modification example.

FIG. 12 is a plan view illustrating an example of a configuration of a shot region Rs of a first modification example. The shot region Rs of the present modification example is different from the shot region Rs of the above embodiment (FIG. 2) in that the shot region Rs of the present modification example includes a third exposure alignment region α3 and a third deviation measurement region β3.

Figure 13:
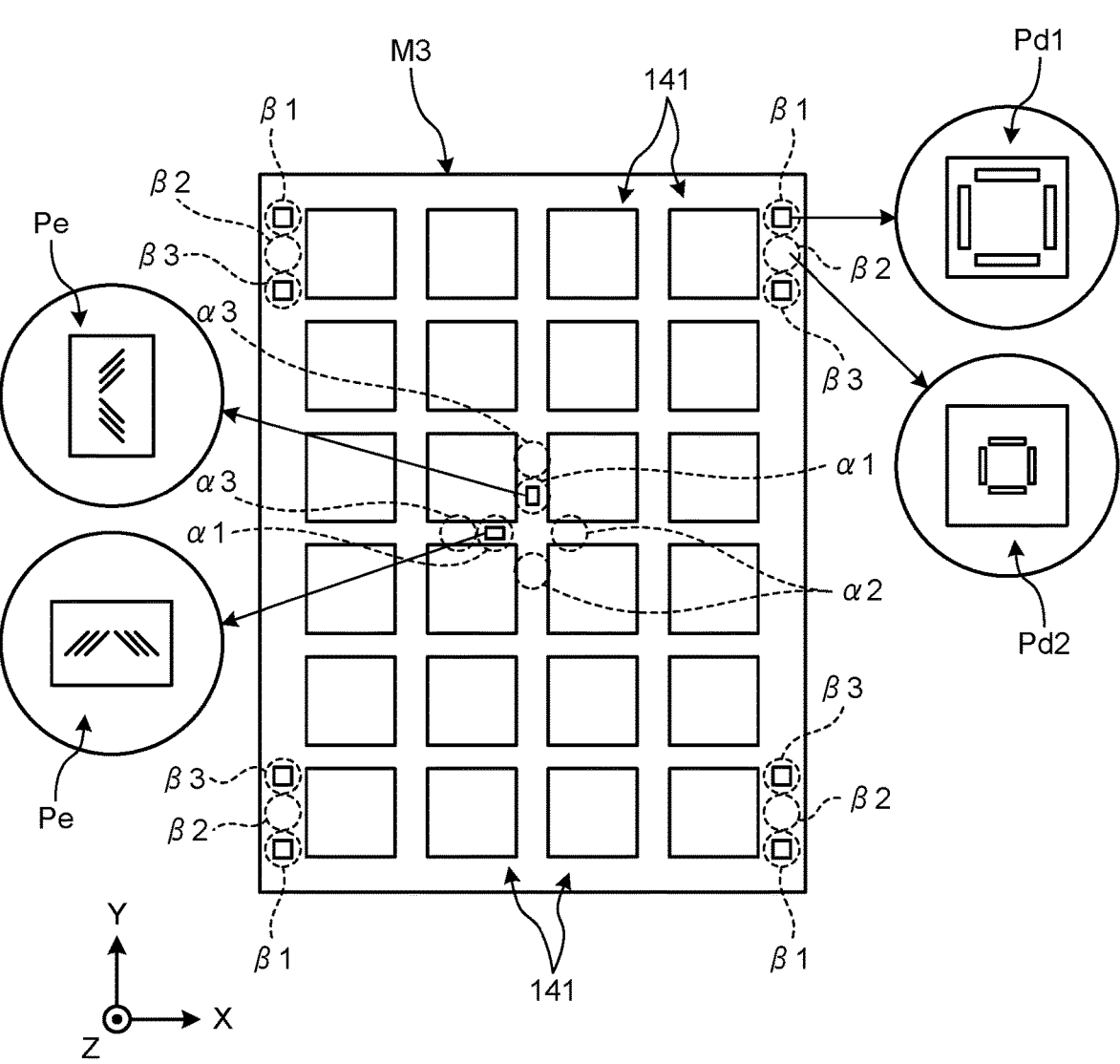
FIG. 13 is a plan view illustrating an example of a structure of a third mask of the first modification example.
Figure 14:
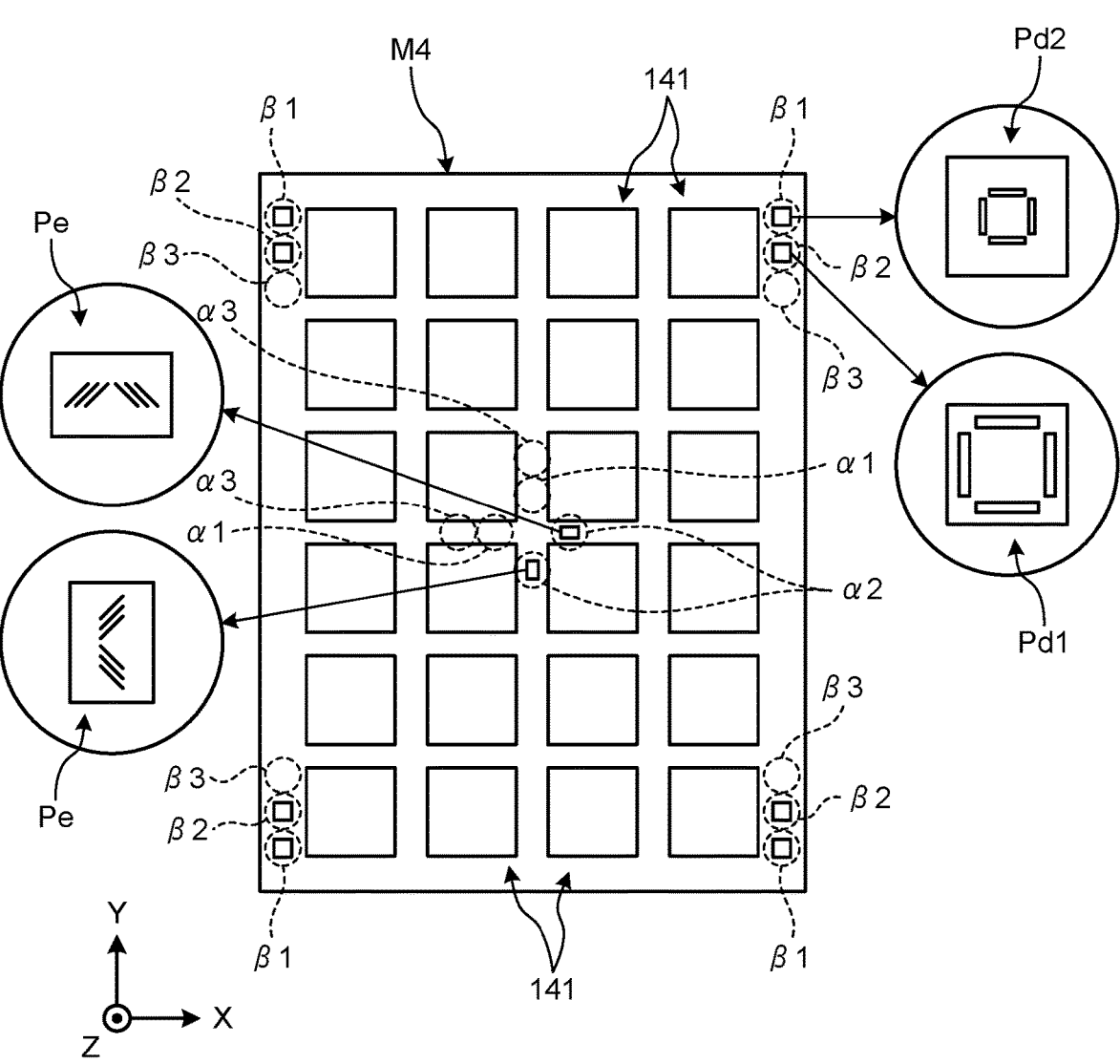
FIG. 14 is a plan view illustrating an example of a structure of a fourth mask of the first modification example.
Figure 15:
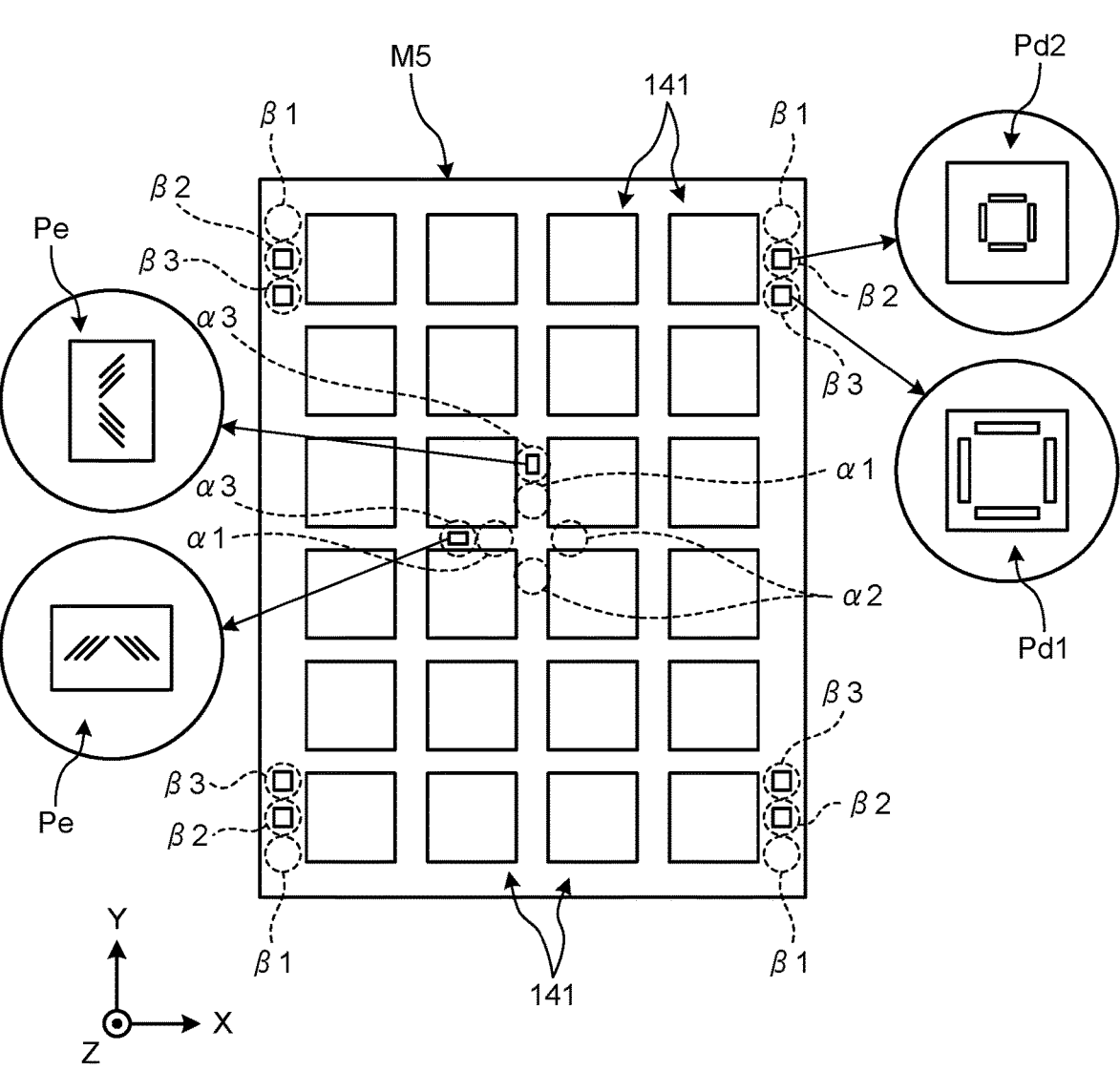
FIG. 15 is a plan view illustrating an example of a structure of a fifth mask of the first modification example.

FIG. 13 is a plan view illustrating an example of a structure of a third mask M3 of the first modification example. FIG. 14 is a plan view illustrating an example of a structure of a fourth mask M4 of the first modification example. FIG. 15 is a plan view illustrating an example of a structure of a fifth mask M5 of the first modification example. In the present modification example, an exposure alignment mark Me and a deviation measurement mark Md are formed using the three kinds of masks of the third mask M3, the fourth mask M4, and the fifth mask M5.

As illustrated in FIG. 13, the exposure alignment pattern Pe of the third mask M3 is formed in a position corresponding to the first exposure alignment region α1, and is not formed in a position corresponding to the second exposure alignment region α2 or the third exposure alignment region α3. The first deviation measurement pattern Pd1 of the third mask M3 is formed in a position corresponding to the first deviation measurement region β1, and is not formed in a position corresponding to the second deviation measurement region β2 or the third deviation measurement region β3. The second deviation measurement pattern Pd2 of the third mask M3 is formed in a position corresponding to the third deviation measurement region β3, and is not formed in a position corresponding to the first deviation measurement region β1 or the second deviation measurement region β2.

As illustrated in FIG. 14, the exposure alignment pattern Pe of the fourth mask M4 is formed in a position corresponding to the second exposure alignment region α2, and is not formed in a position corresponding to the first exposure alignment region α1 or the third exposure alignment region α3. The first deviation measurement pattern Pd1 of the fourth mask M4 is formed in a position corresponding to the second deviation measurement region β2, and is not formed in a position corresponding to the first deviation measurement region β1 or the third deviation measurement region β3. The second deviation measurement pattern Pd2 of the fourth mask M4 is formed in a position corresponding to the first deviation measurement region β1, and is not formed in a position corresponding to the second deviation measurement region β2 or the third deviation measurement region β3.

As illustrated in FIG. 15, the exposure alignment pattern Pe of the fifth mask M5 is formed in a position corresponding to the third exposure alignment region α3, and is not formed in a position corresponding to the first exposure alignment region α1 or the second exposure alignment region α2. The first deviation measurement pattern Pd1 of the fifth mask M5 is formed in a position corresponding to the third deviation measurement region β3, and is not formed in a position corresponding to the first deviation measurement region β1 or the second deviation measurement region β2. The second deviation measurement pattern Pd2 of the fifth mask M5 is formed in a position corresponding to the second deviation measurement region β2, and is not formed in a position corresponding to the first deviation measurement region β1 or the third deviation measurement region β3.

FIG. 16 is a diagram conceptually illustrating an example of exposure alignment processing and deviation measurement processing of the first modification example. Like in the above embodiment, the exposure alignment processing of the present modification example is performed using an exposure alignment mark Me formed by exposure alignment level differences 171 formed on the layer under a target story being propagated to the uppermost surface of the target story. The exposure alignment level difference 171 formed on the N-th story is formed to propagate up to the uppermost surface of the (N+1)-th story and not to propagate to the uppermost surface of the (N+2)-th story. In addition, like in the above embodiment, the deviation measurement processing of the present modification example is performed using a deviation measurement mark Md including a first deviation measurement mark Md1 formed by deviation measurement level differences 181 formed on the layer under a target story being propagated to the uppermost surface of the target story and a second deviation measurement mark Md2 formed on the target story.

In the present modification example, three kinds of masks (the third mask M3, the fourth mask M4, and the fifth mask M5) are used every three stories in turn. That is, the third mask M3 is used on the first story L1 and the fourth story L4, the fourth mask M4 is used on the second story L2 and the fifth story L5, and the fifth mask M5 is used on the third story L3 and the sixth story L6. Thus, three or more kinds of masks may be used as necessary (for example, when three or more kinds of variations of the chip pattern 141 are needed). Even in such a case, the cost, working time, etc. can be reduced as compared to the case where different masks are prepared for stories.

Second Modification Example

Although in the above embodiment a configuration in which memory holes MH are formed in every other story in each of the exposure alignment regions α1 and α2 is given as an example (FIG. 9K, etc.), the aspect of memory holes MH formed for alignment processing is not limited thereto.

Figure 17:
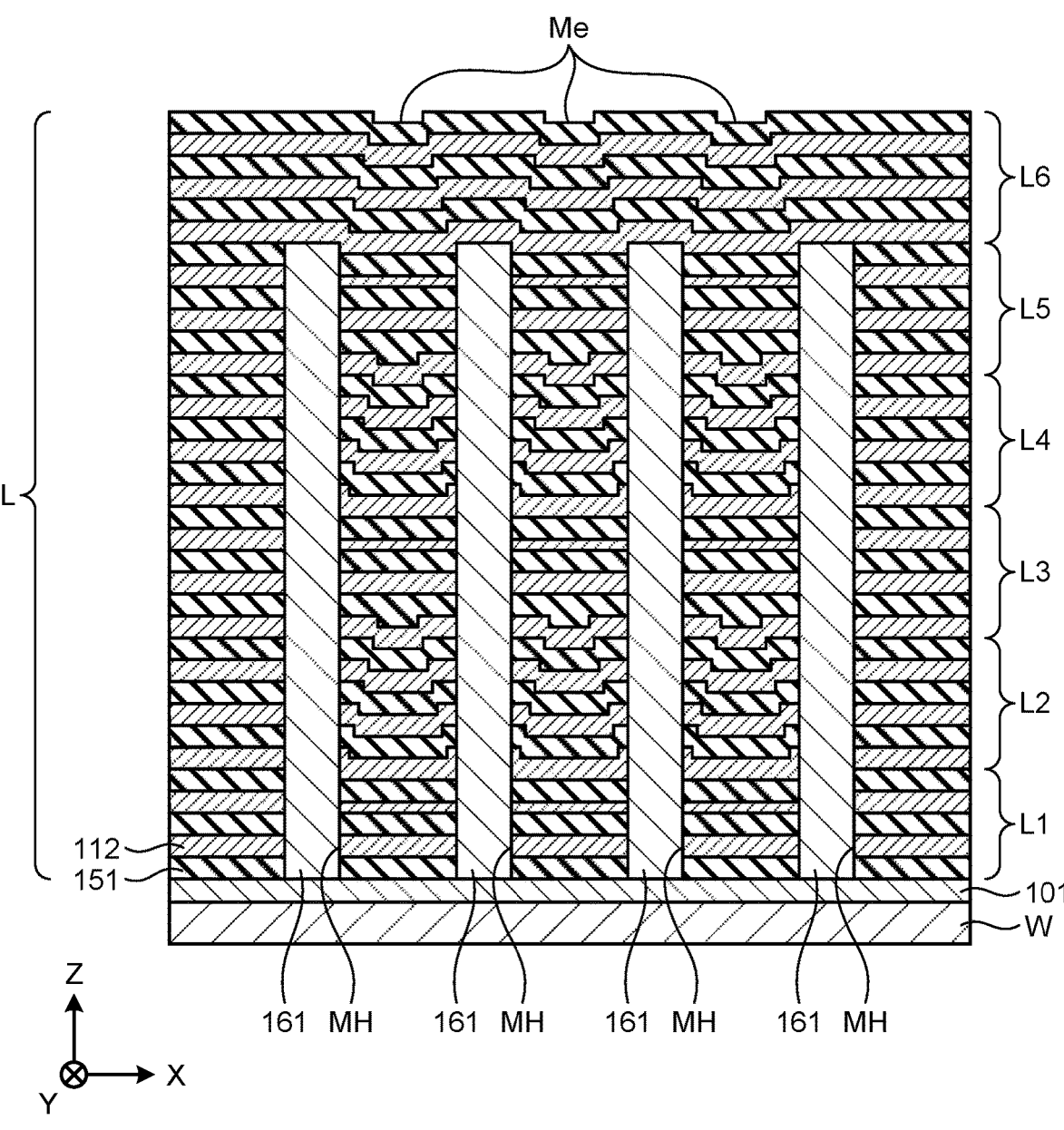
FIG. 17 is a cross-sectional view illustrating an example of a configuration of a stacked body in the first exposure alignment region of a second modification example.

FIG. 17 is a cross-sectional view illustrating an example of a configuration of a stacked body L in the first exposure alignment region α1 of a second modification example. FIG. 17 corresponds to the A-A cross section of FIG. 2. As illustrated in FIG. 17, the memory hole MH in the first exposure alignment region α1 may be formed to be continuous over a plurality of stories. Such an aspect can be similarly applied to the second exposure alignment region α2, the deviation measurement regions β1 and β2, and the like.

Third Modification Example

Figure 18:
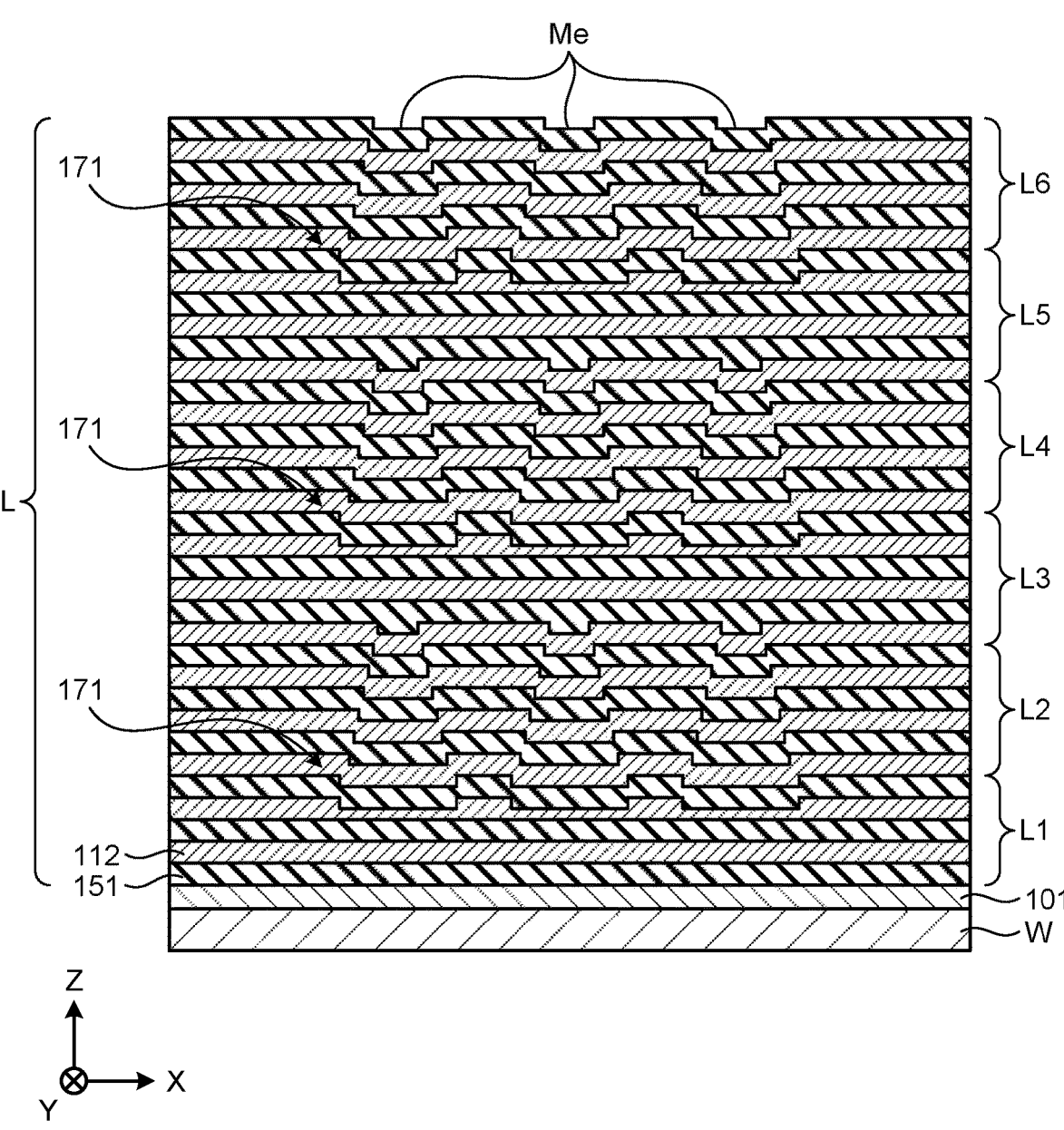
FIG. 18 is a cross-sectional view illustrating an example of a configuration of a stacked body in the first exposure alignment region of a third modification example.

FIG. 18 is a cross-sectional view illustrating an example of a configuration of a stacked body L in the first exposure alignment region α1 of a third modification example. FIG. 18 corresponds to the A-A cross section of FIG. 2. As illustrated in FIG. 18, memory holes MH may not be formed in any story in the first exposure alignment region α1. In such a case, exposure alignment level differences 171 can be formed using a microloading effect or the like. Such an aspect can be similarly applied to the second exposure alignment region α2, the deviation measurement regions β1 and β2, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor structure body
comprising a stacked body with multiple stories in each of which a plurality of conductive layers and a plurality of insulating layers are alternately stacked, the stacked body including a plurality of through holes penetrating the conductive layers and the insulating layers in a stacking direction, wherein,
the multiple stories of the stacked body is four stories or more,
the stacked body includes, in a region corresponding to an identical pair of coordinates in a planar coordinate system intersecting the stacking direction, a plurality of identical alignment marks or deviation measurement marks, and
the identical alignment marks or the deviation measurement marks are placed in a region corresponding to a first pair of coordinates on an uppermost surface of an N-th story (N is an integer equal to or larger than 2) of the multiple stories and a region corresponding to the first pair of coordinates on an uppermost surface of an (N+2)-th story of the multiple stories.

2. The semiconductor structure body according to claim 1, wherein
the identical alignment marks or the deviation measurement marks are placed in a region corresponding to a second pair of coordinates on an uppermost surface of an (N+1)-th story of the multiple stories and a region corresponding to the second pair of coordinates on an uppermost surface of an (N+3)-th story of the multiple stories.

3. The semiconductor structure body according to claim 1, wherein
the identical alignment marks or the deviation measurement marks are each formed by a process in which a level difference formed by reducing a thickness of at least one of the conductive layer and the insulating layer propagates to an uppermost surface of the respective story, and
a width of the level difference is 1 μm or more and 4 μm or less.

4. The semiconductor structure body according to claim 1, comprising:
a plurality of chip regions; and
a dicing region formed to surround a periphery of each of the chip regions, wherein
the identical alignment marks or the deviation measurement marks are each placed in the dicing region.

5. The semiconductor structure body according to claim 4, wherein
the identical alignment marks are each placed in a central portion of a shot region including the plurality of chip regions, or

the deviation measurement marks are each placed in an outer edge portion of the shot region.

6. The semiconductor structure body according to claim 4, wherein a three-dimensional stacked semiconductor memory device is formed in the chip region.

7. A semiconductor structure body comprising a stacked body with multiple stories in each of which a plurality of conductive layers and a plurality of insulating layers are alternately stacked, the stacked body including a plurality of through holes penetrating the conductive layers and the insulating layers in a stacking direction, wherein, the multiple stories of the stacked body is five stories or more, the stacked body includes, in a region corresponding to an identical pair of coordinates in a planar coordinate system intersecting the stacking direction, a plurality of identical alignment marks or deviation measurement marks, and the identical alignment marks or the deviation measurement marks are placed in a region corresponding to a first pair of coordinates on an uppermost surface of an N-th story (N is an integer equal to or larger than 2) of the multiple stories and a region corresponding to the first pair of coordinates on an uppermost surface of an (N+3)-th story of the multiple stories.

8. The semiconductor structure body according to claim 7, wherein the identical alignment marks or the deviation measurement marks are placed in a region corresponding to a second pair of coordinates on an uppermost surface of an (N+1)-th story of the multiple stories and a region corresponding to the second pair of coordinates on an uppermost surface of an (N+4)-th story of the multiple stories, and the identical alignment marks or the deviation measurement marks are placed in a region corresponding to a third pair of coordinates on an uppermost surface of an (N+2)-th story of the multiple stories and a region corresponding to the third pair of coordinates on an uppermost surface of an (N+5)-th story of the multiple stories.

* * * * *